US012518975B2

(12) United States Patent
Nguyen et al.

(10) Patent No.: US 12,518,975 B2
(45) Date of Patent: Jan. 6, 2026

(54) ETCHING METHOD

(71) Applicant: Hitachi High-Tech Corporation, Tokyo (JP)

(72) Inventors: Thi-Thuy-Nga Nguyen, Aichi (JP); Kenji Ishikawa, Aichi (JP); Masaru Hori, Aichi (JP); Kazunori Shinoda, Tokyo (JP); Hirotaka Hamamura, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 218 days.

(21) Appl. No.: 18/277,146

(22) PCT Filed: Apr. 28, 2022

(86) PCT No.: PCT/JP2022/019384

§ 371 (c)(1),
(2) Date: Aug. 14, 2023

(87) PCT Pub. No.: WO2023/209982

PCT Pub. Date: Nov. 2, 2023

(65) Prior Publication Data

US 2025/0022719 A1 Jan. 16, 2025

(51) Int. Cl.

| | |
|---|---|
| ***H01L 21/3213*** | (2006.01) |
| *H10D 30/67* | (2025.01) |
| *H10D 64/66* | (2025.01) |

(52) U.S. Cl.

CPC .. *H01L 21/32136* (2013.01); *H01L 21/32138* (2013.01); *H10D 30/6735* (2025.01); *H10D 64/667* (2025.01)

(58) Field of Classification Search

None

See application file for complete search history.

(56) References Cited

U.S. PATENT DOCUMENTS

| | | |
|---|---|---|
| 5,195,045 A | 3/1993 | Keane et al. |
| 5,712,592 A | 1/1998 | Stimson et al. |

(Continued)

FOREIGN PATENT DOCUMENTS

| | | |
|---|---|---|
| JP | H06045326 A | 2/1994 |
| JP | H07254606 A | 10/1995 |

(Continued)

OTHER PUBLICATIONS

Patrick Verdonck, et al., "Analysis of the Etching Mechanisms of Tungsten in Fluorine Containing Plasmas", Journal of Electrochemical Society, 1995, vol. 142, No. 6, pp. 1971-1976.

(Continued)

*Primary Examiner* — Binh X Tran

(74) *Attorney, Agent, or Firm* — Miles & Stockbridge, P.C.

(57) ABSTRACT

A continuous or cyclic etching method for etching a metal carbide over a metal nitride is disclosed. The etching method includes the following steps: supplying plasma that is generated from a gas mixture that contains $N_2$ and $H_2$ and does not contain halogen gases including fluorine, chlorine, bromine, and iodine to a surface of metal carbide on at least a part of the surface, to modify the surface of metal carbide, and removing the modified surface on metal carbide by ion irradiation or by heating.

25 Claims, 24 Drawing Sheets

Start

Load wafer in the chamber S01

Set wafer temperature S02

Supply $N_2/H_2$ gas in the chamber S03

Apply VHF power and bias power S04 is etched amount sufficient ? S05

No

Yes

Unload wafer from the chamber S06

End

(56) References Cited

U.S. PATENT DOCUMENTS

| | | | |
|---|---|---|---|
| 5,770,922 A | 6/1998 | Gerrish et al. | |
| 6,265,831 B1 | 7/2001 | Howald et al. | |
| 6,270,618 B1 | 8/2001 | Nakano et al. | |
| 6,351,683 B1 | 2/2002 | Johnson et al. | |
| RE38,273 E | 10/2003 | Gerrish et al. | |
| 6,677,711 B2 | 1/2004 | MacGearailt | |
| 6,919,689 B2 | 7/2005 | Jafarian-Tehrani et al. | |
| 7,084,832 B2 | 8/2006 | Pribyl | |
| 7,190,119 B2 | 3/2007 | Patrick et al. | |
| 7,645,357 B2 | 1/2010 | Paterson et al. | |
| 8,038,896 B2 | 10/2011 | Ikegami et al. | |
| 8,546,266 B2 | 10/2013 | Mori et al. | |
| 9,431,268 B2 | 8/2016 | Lill et al. | |
| 9,548,228 B2 | 1/2017 | Chandrashekar et al. | |
| 9,978,610 B2 | 5/2018 | Fung et al. | |
| 2001/0022293 A1 | 9/2001 | Maeda et al. | |
| 2002/0123229 A1 | 9/2002 | Ono et al. | |
| 2004/0185670 A1 | 9/2004 | Hamelin et al. | |
| 2006/0037704 A1 | 2/2006 | Iwata et al. | |
| 2006/0048892 A1 | 3/2006 | Arase et al. | |
| 2007/0044716 A1 | 3/2007 | Tetsuka et al. | |
| 2007/0187359 A1* | 8/2007 | Nakagawa | C23F 4/00 216/75 |
| 2007/0187362 A1* | 8/2007 | Nakagawa | C23F 4/00 216/81 |
| 2008/0128087 A1 | 6/2008 | Hayano et al. | |
| 2008/0190893 A1 | 8/2008 | Mori et al. | |
| 2008/0268645 A1 | 10/2008 | Kao et al. | |
| 2008/0277062 A1 | 11/2008 | Koshimizu et al. | |
| 2009/0017259 A1* | 1/2009 | Nakagawa | C04B 41/009 428/156 |
| 2009/0023296 A1 | 1/2009 | Nishizuka | |
| 2010/0258529 A1 | 10/2010 | Mori et al. | |
| 2011/0297533 A1 | 12/2011 | Mori et al. | |
| 2013/0228550 A1 | 9/2013 | Mori et al. | |
| 2014/0102640 A1 | 4/2014 | Yokogawa et al. | |
| 2014/0225503 A1 | 8/2014 | Mori et al. | |
| 2015/0072533 A1 | 3/2015 | Muraki et al. | |
| 2015/0107769 A1* | 4/2015 | Nakano | C23C 14/0641 204/192.15 |
| 2015/0132953 A1 | 5/2015 | Nowling et al. | |
| 2015/0179464 A1 | 6/2015 | Wang et al. | |
| 2015/0262829 A1 | 9/2015 | Park et al. | |
| 2015/0270148 A1 | 9/2015 | Shinoda et al. | |
| 2015/0357210 A1 | 12/2015 | Mori et al. | |
| 2016/0035585 A1 | 2/2016 | Xiang et al. | |
| 2016/0126071 A1 | 5/2016 | Kitamura et al. | |
| 2017/0053810 A1 | 2/2017 | Yang et al. | |
| 2017/0084542 A1 | 3/2017 | Kato et al. | |
| 2017/0167032 A1 | 6/2017 | Kim et al. | |
| 2017/0194166 A1 | 7/2017 | Tan et al. | |
| 2018/0211824 A1 | 7/2018 | Kudo et al. | |
| 2019/0067032 A1 | 2/2019 | Shinoda et al. | |
| 2019/0088555 A1 | 3/2019 | Xie et al. | |
| 2019/0259626 A1 | 8/2019 | Masahiro et al. | |
| 2021/0050222 A1* | 2/2021 | Katsunuma | H01L 21/32137 |
| 2021/0242030 A1 | 8/2021 | Shinoda et al. | |
| 2024/0222138 A1 | 7/2024 | Nguyen et al. | |

FOREIGN PATENT DOCUMENTS

| | | |
|---|---|---|
| JP | H11185998 A | 7/1999 |
| JP | 2000091321 A | 3/2000 |
| JP | 2001185542 A | 7/2001 |
| JP | 2002343768 A | 11/2002 |
| JP | 2003347278 A | 12/2003 |
| JP | 2005259839 A | 9/2005 |
| JP | 2006066905 A | 3/2006 |
| JP | 2007059567 A | 3/2007 |
| JP | 2008244146 A | 10/2008 |
| JP | 2011082180 A | 4/2011 |
| JP | 2016139792 A | 8/2016 |
| JP | 2017063186 A | 3/2017 |
| JP | 2019040932 A | 3/2019 |
| KR | 10-2019-0099126 A | 8/2019 |
| KR | 10-2023-0058000 A | 5/2023 |
| TW | 200620454 A | 6/2006 |
| TW | 200802592 A | 1/2008 |
| TW | 200829087 A | 7/2008 |
| TW | 201533796 A | 9/2015 |
| WO | 2021002753 A1 | 1/2021 |

OTHER PUBLICATIONS

Search Report mailed Oct. 7, 2014 in U.S. Appl. No. 14/177,251.

Office Action mailed Jan. 19, 2015 in Korean Application No. 10-2014-0013325.

Office Action mailed Jan. 15, 2016 in Taiwanese Application No. 10520049730.

Office Action mailed Aug. 9, 2016 in Japanese Application No. 2013-112562.

Office Action mailed Jul. 13, 2018 in Korean Application No. 10-2014-0013325.

Office Action mailed Jul. 13, 2018 in Korean Application No. 10-2015-0053111.

Office Action mailed Sep. 26, 2018 in Taiwanese Application No. 107106284.

Search Report mailed Jul. 16, 2019 in International Application No. PCT/JP2019/016930.

Office Action mailed Apr. 20, 2021 in Japanese Application No. 2020-509124.

Office Action mailed May 11, 2021 in U.S. Appl. No. 16/646,057.

Allowance mailed Aug. 27, 2021 in U.S. Appl. No. 16/646,057.

Search Report mailed Jan. 18, 2022 in International Application No. PCT/JP2021/038955.

Written Opinion mailed Jan. 18, 2022 in International Application No. PCT/JP2021/038955.

Office Action mailed Sep. 2, 2024 in Korean Application No. 10-2023-7027105.

Search Report Jul. 26, 2022 mailed in International Application No. PCT/JP2022/019384.

* cited by examiner

FIG. 8

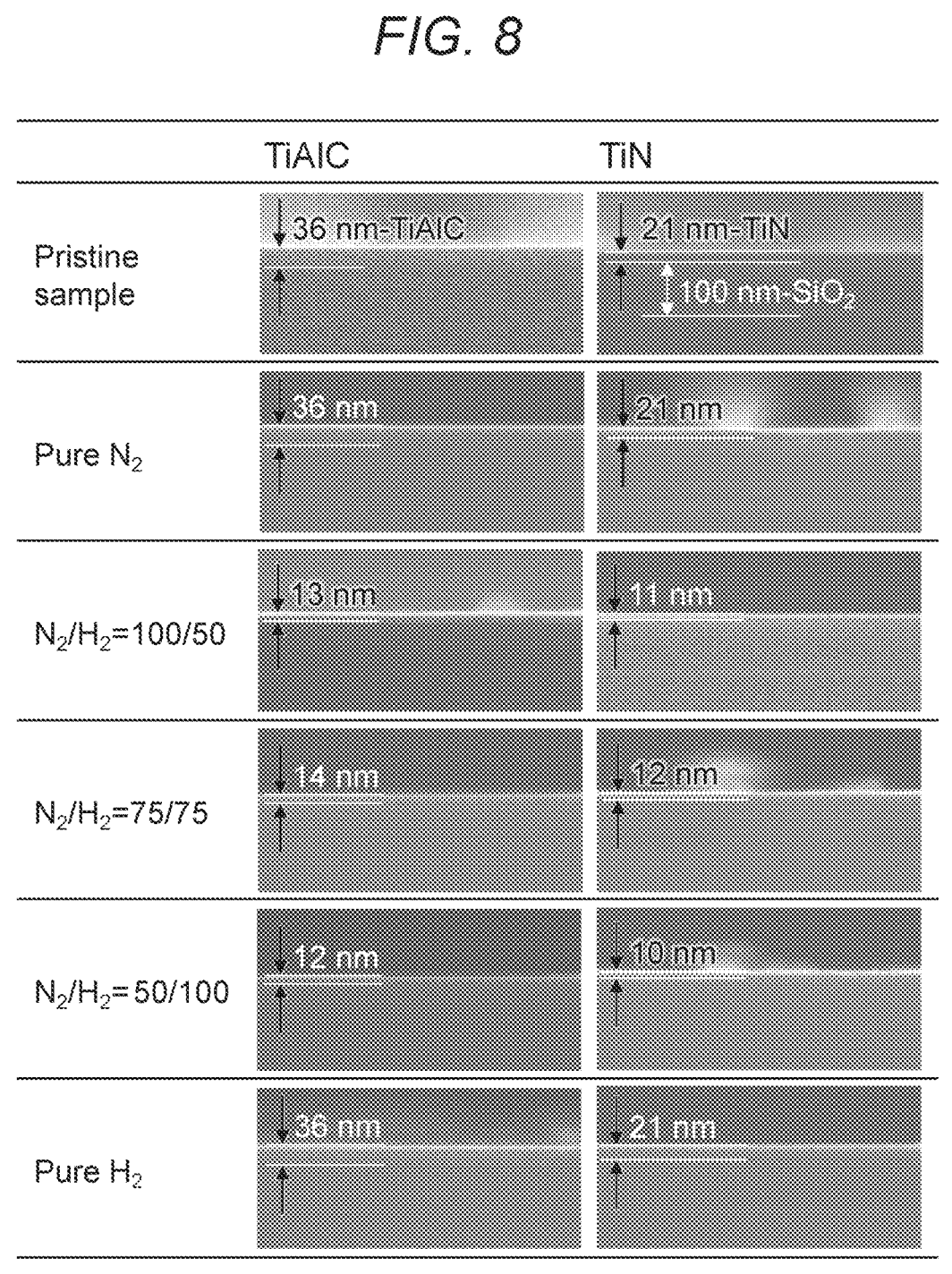

| | TiAlC | TiN |
|---|---|---|
| Pristine sample | 36 nm-TiAlC | 21 nm-TiN<br>100 nm-$SiO_2$ |
| Pure $N_2$ | 36 nm | 21 nm |
| $N_2/H_2$=100/50 | 13 nm | 11 nm |
| $N_2/H_2$=75/75 | 14 nm | 12 nm |
| $N_2/H_2$=50/100 | 12 nm | 10 nm |
| Pure $H_2$ | 36 nm | 21 nm |

ETCHING METHOD

TECHNICAL FIELD

The present invention relates to an etching method.

BACKGROUND ART

Advanced fabrication of three-dimensional structures of semiconductor devices needs to remove selectively one or more kinds of materials without any removal of the other materials that are not damaged during the fabrication. This is able to control isotropic etching technology and multiple metal gate materials made of titanium containing compounds.

The work function metal gate can be used in stacked structure of multiple layers in a fin-type field effect transistor (FinFET). Among these metal gates, a ternary compound of TiAlC has good controllability of threshold voltage of the n-type FinFET and thermal resistance for semiconductor manufacturing processes. To fabricate the FinFET is achieved to etch this TiAlC film without any removal of the untargeted materials, for instance TiN metal gate for p-type FinFETs, which expose in areas surrounding of TiAlC or appear underlying of TiAlC films. Selectivity of TiAlC is required against metal compounds, insulators, and semiconductors, as exampled TiN, TaN, $HfO_2$, Si, and so on.

Until this invention, wet etching using $H_2O_2$ mixtures was applied. Choosing chemicals, the wet etching enables us to remove TiAlC films, however this wet etching will damage on the other exposed materials due to low etch rates and insufficient selectivity, resulting to prolong a treatment time.

In the related art, etching of titanium carbide that may contain aluminum using wet peroxide mixture is disclosed in US 2015/0132953 A1. In the method, the maximum selectivity of TiC over TiN can be obtained with the liquid mixture of ammonia, peroxide, and water at the temperature of 25° C. in which the etch rate of TiC is 8.6 nm/min.

To fabricate next generation FinFETs in semiconductor industries, a controllable and highly selective removal method is required. To increase selectivity of etch rates for TiAlC films, dry etching and plasma etching technologies are feasible. In the related art, the dry etching for ternary material TiAlC has been developed by near atmospheric pressure plasma. This is disclosed in PCT/JP2021/038955. This method relies on processing with high density of radicals generated in a Ar/liquid vapor plasma such as $NH_4OH$ vapor, $H_2O$ vapor, or the vapor mixture of $NH_4OH$, $H_2O_2$, and $H_2O$. Ions and charged particles have a very short lifetime and thus far substrate surface will not irradiate without any ions. Hence, isotropic etching can be obtained in conditions which are observed optical emissions of NH and H atom.

CITATION LIST

Patent Literature

[PTL 1]
US 2015/0132953 A1

SUMMARY OF INVENTION

Technical Problem

A next generation fin-shaped and nano-sheets field effect transistor is strongly required a stack of metal thin layers. A stack structure of TiAlC film on TiN film is required. In this case, both anisotropic etching and isotropic are required. In the case of anisotropic etching, suppressing lateral etching at sidewall for untargeted films is an important issue. Metal containing films are in general etched by using halogen containing gases mixture plasma. However, the halogen mixtures produce lateral etching features. This requires non-halogen mixture plasma. In the case of isotropic etching, suppressing damages produced in underlayers is important.

Solution to Problem

The present inventors have been developing a new dry etching method for anisotropic and isotropic etching of the metal carbide without any removal of metal nitride using non-halogen mixture plasma.

Plasma is a source of ions, radicals, and so on. Ions or charged particles can reach the substrate surface. At lower pressure than 1000 Pa, ions or charged particles impinge on the surface in particular cases with application of bias powers. A low pressure plasma that is lower than 100 Pa is more preferable.

Here the technology of both continuous etching and cyclic etching are applied. As for atomic layer etching, a cyclic etching can be treated self-limiting manner of selective removal of a film against the other films. Ion irradiations or heating are necessary in this invention and anisotropic or isotropic etching is obtained.

First, surface modification may be controlled by treating surface with those ions and radicals, as excited species and photons. The modified layer consists of metal compounds that contain nitrogen, carbon, and hydrogen.

This application discloses the best example of selective removal of metal carbides over metal nitrides by treating plasma etching process with an addition of small amounts less than 10% oxygen into a mixture of $N_2$ and $H_2$ gases. The etching mechanisms can be described by selective removal of volatile products containing NH and CN on metal carbides and selective suppression via nitridation on metal nitrides. Bias power for controlling ion bombardment energy toward the surface should be set in the range below the threshold of beginning of ion-enhanced removal of metal nitrides.

Advantageous Effects of Invention

An effect, which is obtained by a representative configuration of the invention disclosed in this specification, is as follows. According to embodiments of this invention, it is possible to provide a technology of dry etching a titanium aluminum carbide film with high surface reaction with ion-induced or heating-induced removal of surface modified layers, in continuous or in cyclic etching manner. High selective etching of titanium aluminum carbide over titanium nitride and the other materials can be obtained by different surface reactions under energetic ion bombardments or heating. Instead of using halogens such as fluorine, chlorine, bromine, lateral etching at sidewalls of untargeted materials can be suppressed. Non-halogen based chemistries, Na, $H_2$ and $O_2$ mixtures can be used at 50° C. or higher than 20° C. The method can be applied for anisotropic or isotropic selective etch of other metal carbides over metal nitrides.

BRIEF DESCRIPTION OF DRAWINGS

FIG. 8 are a summary of views illustrating cross-sectional scanning electron microscope images of TiAlC and TiN films before and after the plasma etching in various mixture conditions at pressure of 4 Pa, and treatment time for 10 min.

DESCRIPTION OF EMBODIMENTS

The present inventors have attempted to etch a titanium aluminum carbide film by using non-halogen gas mixture. As a result, they obtained the following findings.

(1) Modification of TiAlC surface was successfully produced by treatment using non-halogen based gas mixture.

(2) Desorption of the volatile products can be obtained by ion bombardment with appropriate incident energy or by heating.

(3) Suppression of TiN etching was successfully obtained by addition of small amount $O_2$ in a $N_2$ and $H_2$ mixture plasma. This induces high selective removal of TiAlC over TiN films.

(4) Incident energy of ions should be set under the threshold for ion-enhanced removal process of TiAlC and TiN films. Relatively high etch rates of TiAlC improve the selectivity of TiAlC over TiN.

(5) Substrate temperature should be set at 50° C. or higher than 20° C., because unselective desorption reduces the selectivity of TiAlC removal over TiN.

Example Process 1

The best example of this invention will be described with reference from FIG. 1 to FIG. 13. The description will be given of an example in design an anisotropically plasma etching process of titanium aluminum carbide films on a titanium nitride film on a silicon wafer and selected plasma chemistries for highly selective removal of metal carbides (TiAlC, TiC, and AlC) over metal nitrides (TiAlN, TiN, and AlN).

Figure 1:
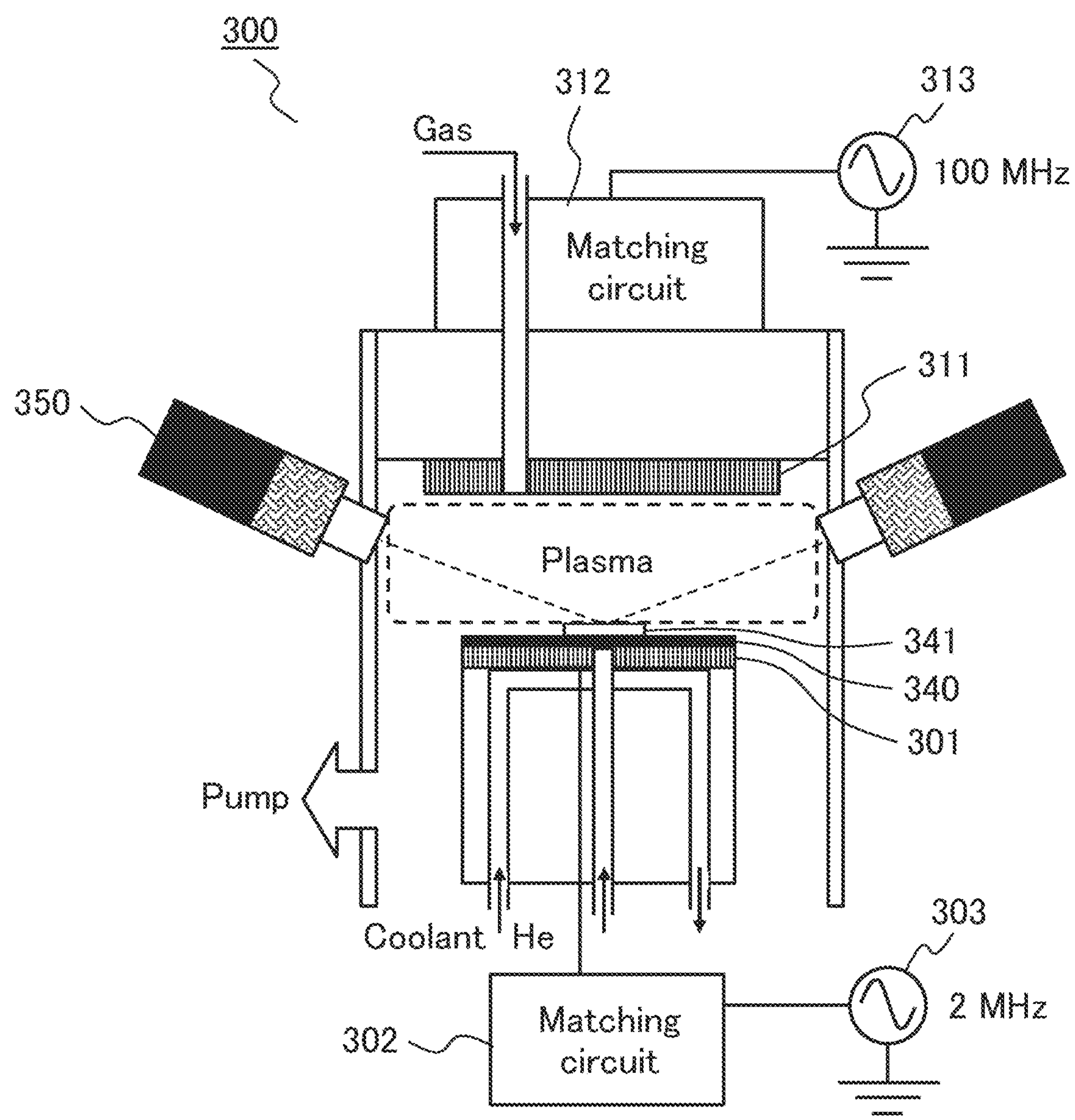
FIG. 1 is a view illustrating an example of a design of a capacitively coupled plasma (CCP) etching system.

FIG. 1 is a view illustrating an example of a design of a capacitively coupled plasma (CCP) etching system 300. Spectroscopic ellipsometer 350 is equipped with the system for in situ observation of surface (sample 341) of the wafer 340, which is placed on the lower electrode 301. The upper electrode 311 is connected with very high frequency (VHF) power 313 (100 MHz) through the matching circuit 312. The lower electrode 301 is connected with a middle frequency (MF) power 303 (2 MHz) through another matching circuit 302. Here, although this example describes application of this invention to a CCP etching system, this invention is also applicable to other etching systems including inductively coupled plasma (ICP) and electron cyclotron resonance (ECR) plasma etching systems.

Figure 2:
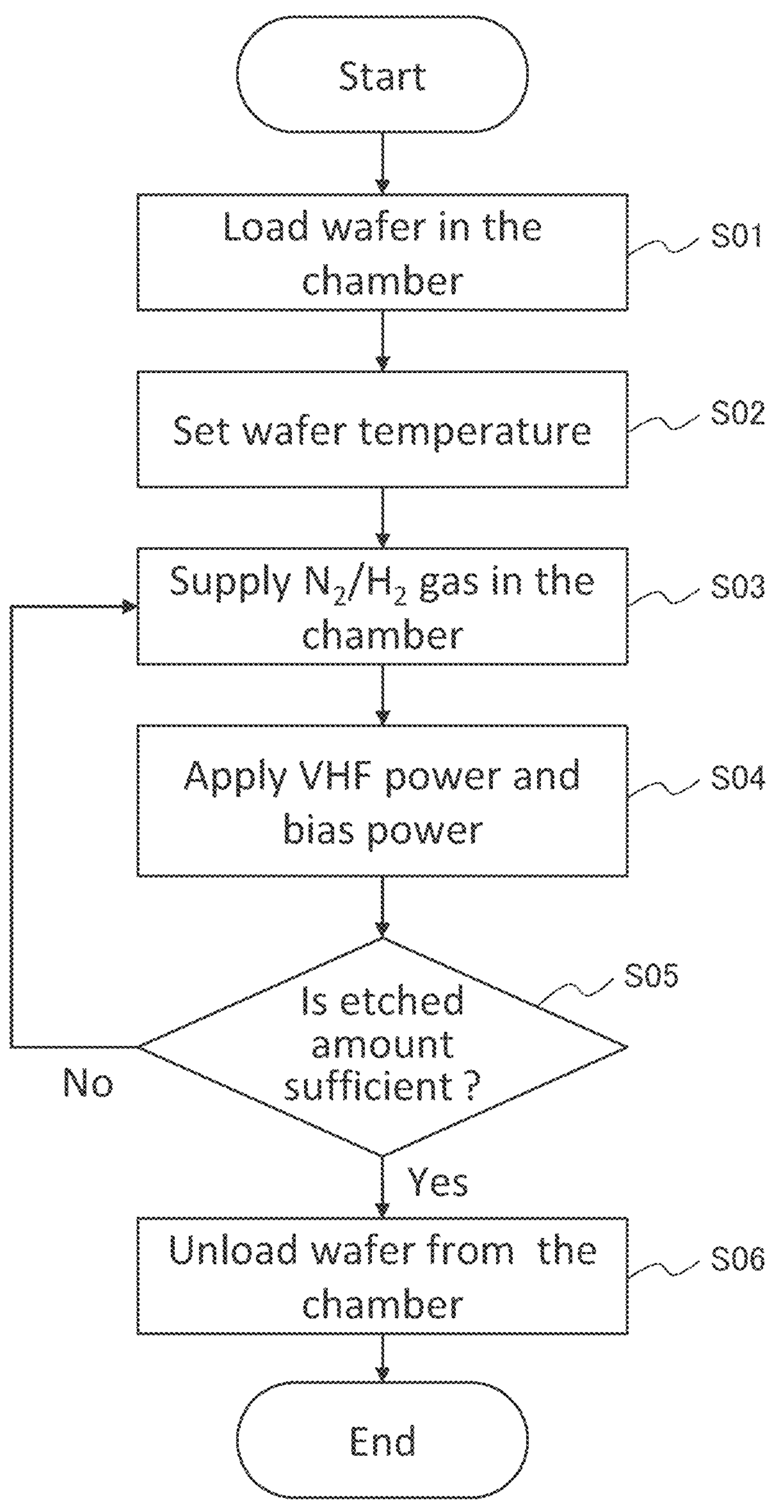
FIG. 2 is a schematic procedure in the continuous etching method of the titanium aluminum carbide film.

FIG. 2 schematically illustrates a procedure in the continuous etching method of the titanium aluminum carbide film according to this embodiment. The wafer will be processed in a chamber having a system for generation of capacitively coupled plasma. The wafer is loaded on the lower electrode 301 of the chamber (S01). Then, the temperature of the wafer is set by circulating a coolant (S02). A gas mixture of $N_2$ and $H_2$ is then introduced in the chamber from the gas inlet through the upper electrode 311 (S03). Plasma is then generated by applying VHF power and bias power (S04). Unless otherwise noted, the excitation VHF power of 300 W is used. The hydrogen-containing and nitrogen-containing ions and radicals can modify the metal carbides to form metal-nitrogen-hydrocarbon bond. By energy-controlled ion bombardments, only the metal-containing hydrocarbon layer can be desorbed while the metal- and nitrogen-containing layer. A cycle of the surface modification and the removal of metal-containing volatile can be etched selectively only metal carbides against metal nitrides. If the etched amount is sufficient, the wafer is unloaded from the chamber (S05, S06).

Figure 3:
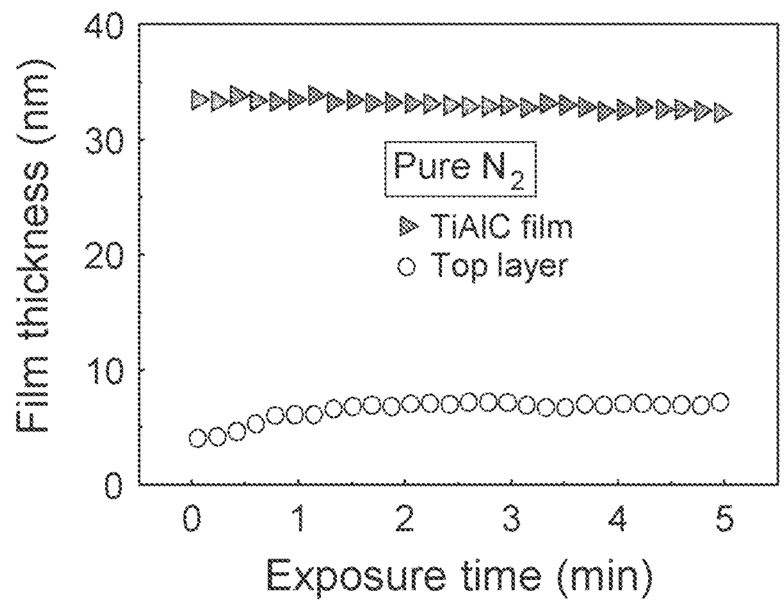
FIG. 3 is a view illustrating of changes in the TiAlC film thickness during the etching process of pure $N_2$ with a flow rate of 150 sccm at 4 Pa.

FIG. 3 is a view illustrating of changes in the TiAlC film thickness during the etching process of pure $N_2$ with a flow rate of 150 sccm at 4 Pa, measuring using the in situ ellipsometry. Modification of the topmost film is monitored at the same time. Bias power of 200 W is applied and substrate temperature at 20° C.

Figure 4:
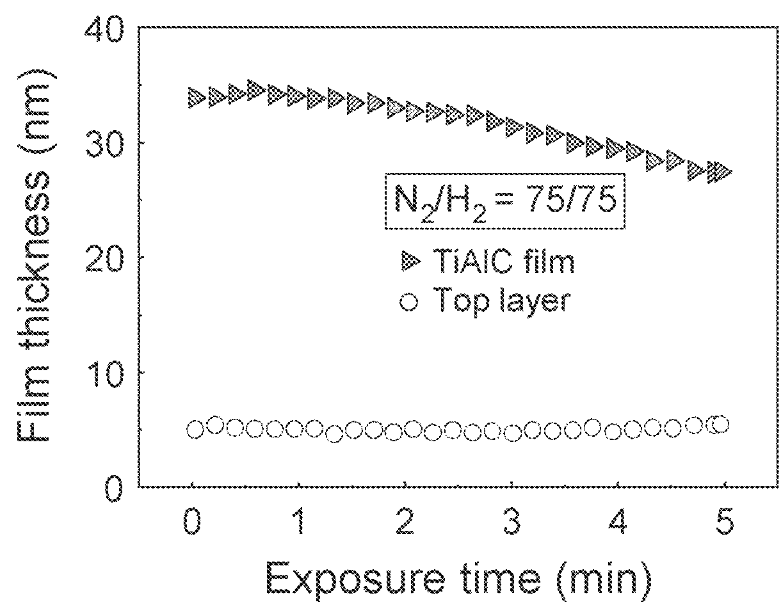
FIG. 4 is a view illustrating of changes in the TiAlC film thickness during the etching process of a mixture of $N_2$ and $H_2$ with flow rates of 75 sccm and 75 sccm at 4 Pa, respectively.

FIG. 4 is a view illustrating of changes in the TiAlC film thickness during the etching process of a mixture of $N_2$ and $H_2$ with flow rates of 75 sccm and 75 sccm at 4 Pa, respectively, measuring using the in situ ellipsometry. Modification of the topmost film is monitored at the same time. Bias power of 200 W is applied and substrate temperature at 20° C.

Figure 5:
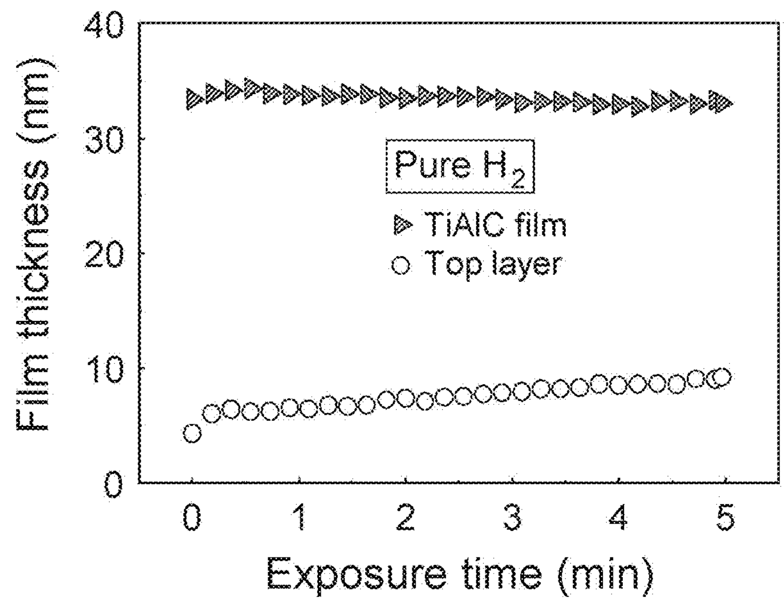
FIG. 5 is a view illustrating of changes in the TiAlC film thickness during the etching process of pure $H_2$ with a flow rate of 100 sccm at 4 Pa.

FIG. 5 is a view illustrating of changes in the TiAlC film thickness during the etching process of pure $H_2$ with a flow rate of 100 sccm at 4 Pa, respectively, measuring using the in situ ellipsometry. Modification of the topmost film is monitored at the same time. Bias power of 200 W is applied and substrate temperature at 20° C.

As seen in FIG. 4, the etch rates of TiAlC are obvious in the mixture of $N_z$ and $H_2$ plasma, as compared with the pure $N_2$ or pure $H_2$ case (FIGS. 3 and 5).

Figure 6:
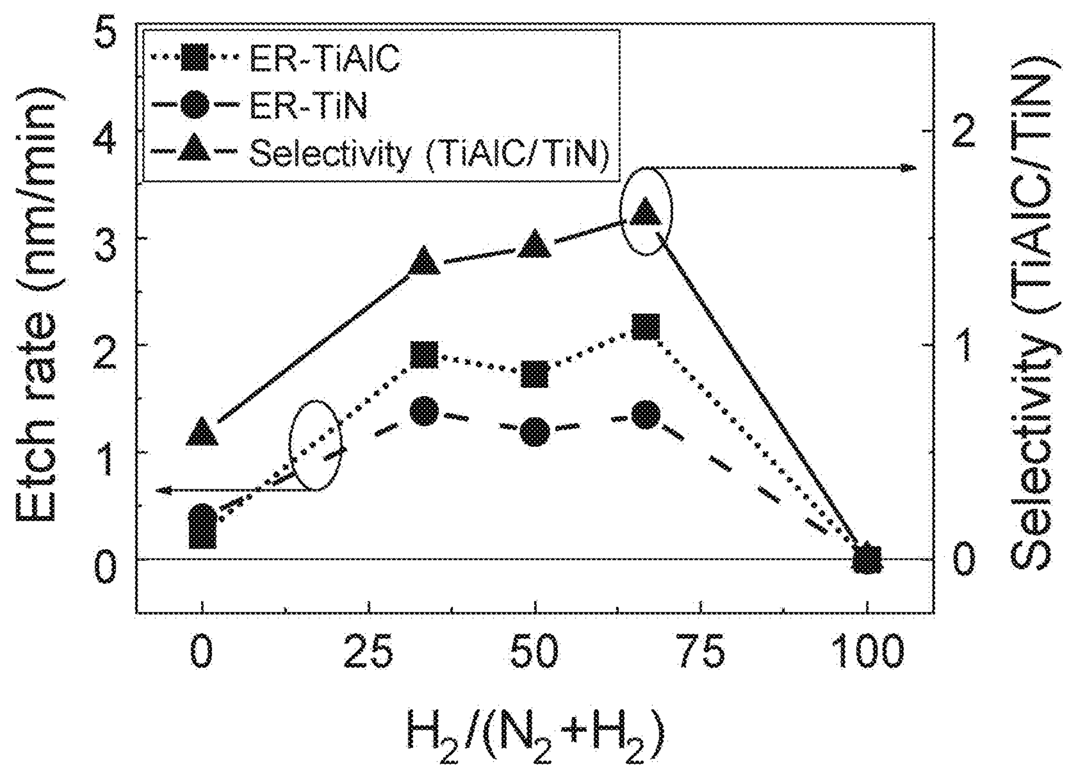
FIG. 6 is a view illustrating of dependence of etch rates of TiAlC and TiN and selectivity (TiAlC/TiN) as a function of fraction of $H_2$ in a mixture of $H_2$ and $N_2$ gases at pressure of 4 Pa, bias power of 200 W, and substrate temperature at 20° C.

FIG. 6 is a view illustrating of dependence of TiAlC etch rates as a function of fraction of $H_2$ in a mixture of $H_2$ and $N_2$ gases at pressure of 4 Pa, bias power of 200 W, and substrate temperature at 20° C. For reference, a dependence of TiN etch rates is also shown. Selectivity is represented by taking a ratio of the TiAlC etch rate with respect to the TiN etch rate.

Figure 7:
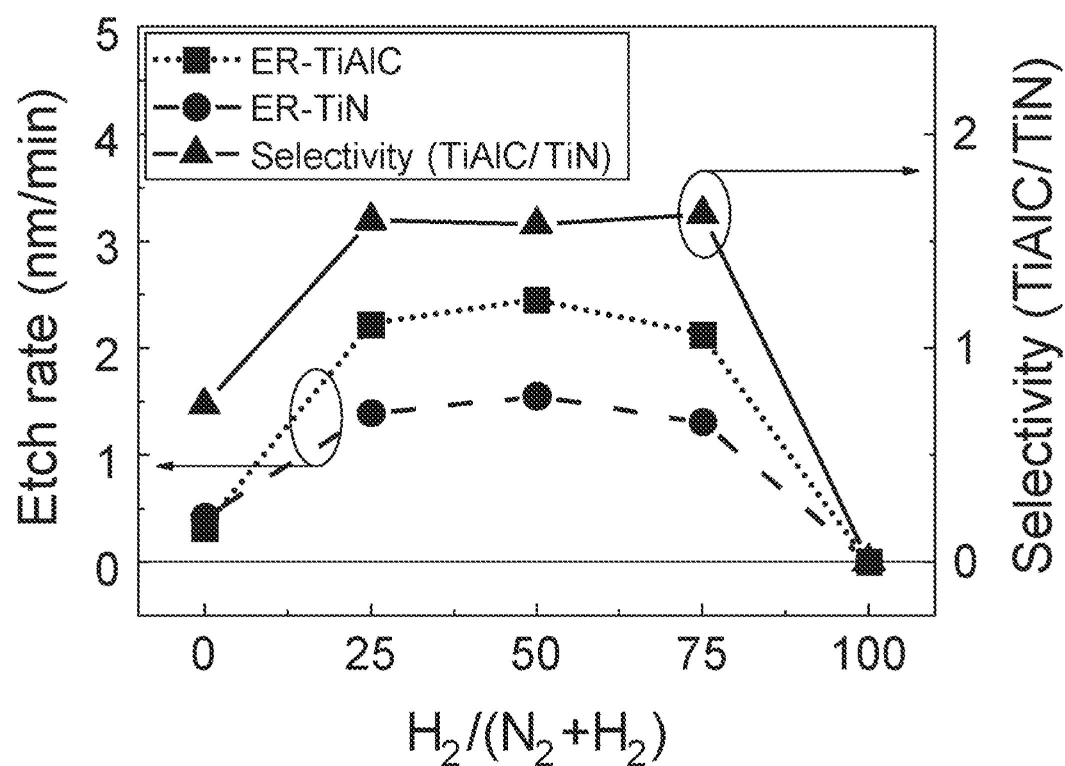
FIG. 7 is a view illustrating of dependence of etch rates of TiAlC and TiN and selectivity (TiAlC/TiN) as a function of fraction of $H_2$ in a mixture of $H_2$ and $N_2$ gases at pressure of 2 Pa, bias power of 200 W, and substrate temperature at 20° C.

FIG. 7 is a view illustrating of dependence of etch rates as a function of fraction of $H_2$ in a mixture of $H_2$ and $N_2$ gases at pressure of 2 Pa, bias power of 200 W, and substrate temperature at 20° C. For reference, a dependence of TiN etch rates is also shown. Selectivity is represented by taking a ratio of the TiAlC etch rate with respect to the TiN etch rate.

FIG. 8 are a summary of views illustrating cross-sectional scanning electron microscope images of TiAlC and TiN films before and after the plasma etching in various mixture conditions at pressure of 4 Pa, and treatment time for 10 min.

Figure 9:
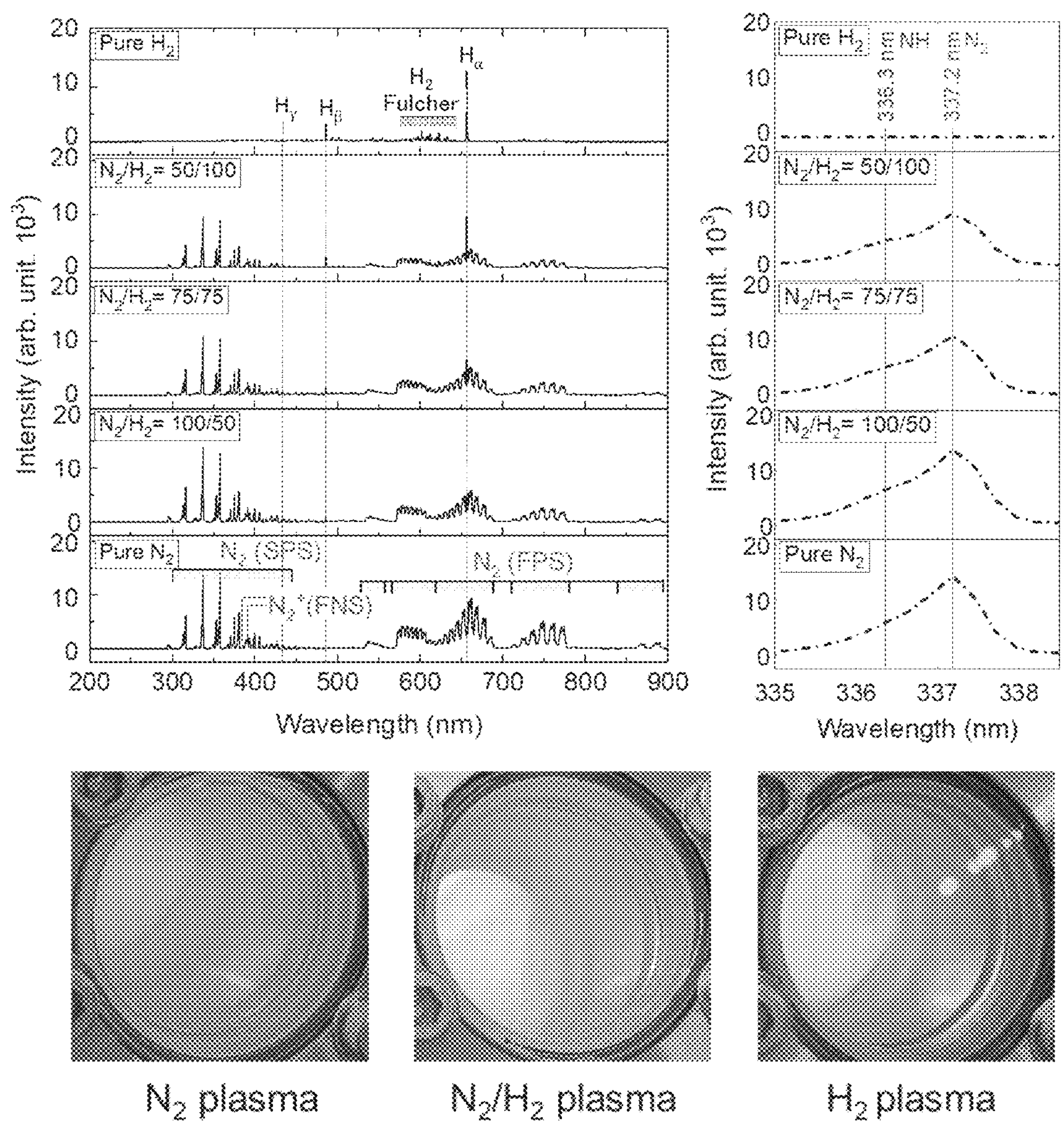
FIG. 9 is a view illustrating optical emission spectra and photograph images of plasmas obtained by the various mixtures of $N_2$ and $H_2$ at pressure of 4 Pa.

FIG. 9 is a view illustrating optical emission spectra and photograph images of plasmas obtained by the various mixtures of $N_2$ and $H_2$ at pressure of 4 Pa.

Figure 10:
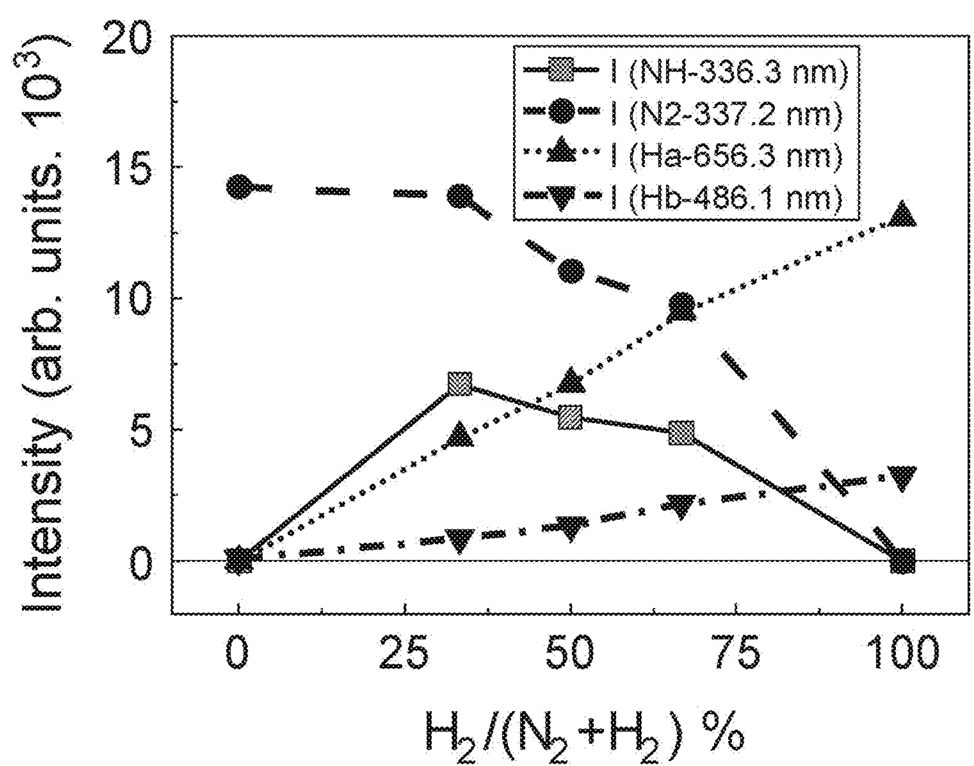
FIG. 10 is a view illustrating dependence of intensity ratios of NH at wavelength of 336.3 nm, the second positive system for $N_2$ at 337.2 nm, Balmer lines for H atom at 656.3 nm and 486.1 nm.

FIG. 10 is a view illustrating dependence of intensity ratios of NH at wavelength of 336.3 nm, the second positive system for $N_2$ at 337.2 nm, Balmer lines for H atom at 656.3 nm and 486.1 nm. When plasma is generated in $H_2$ mixed with $N_2$, optical emission intensities for NH are obvious. In the mixture of $H_2$ and $N_2$ with flow rates of 50 and 100 sccm, the most intense NH emission was observed.

Figure 11:
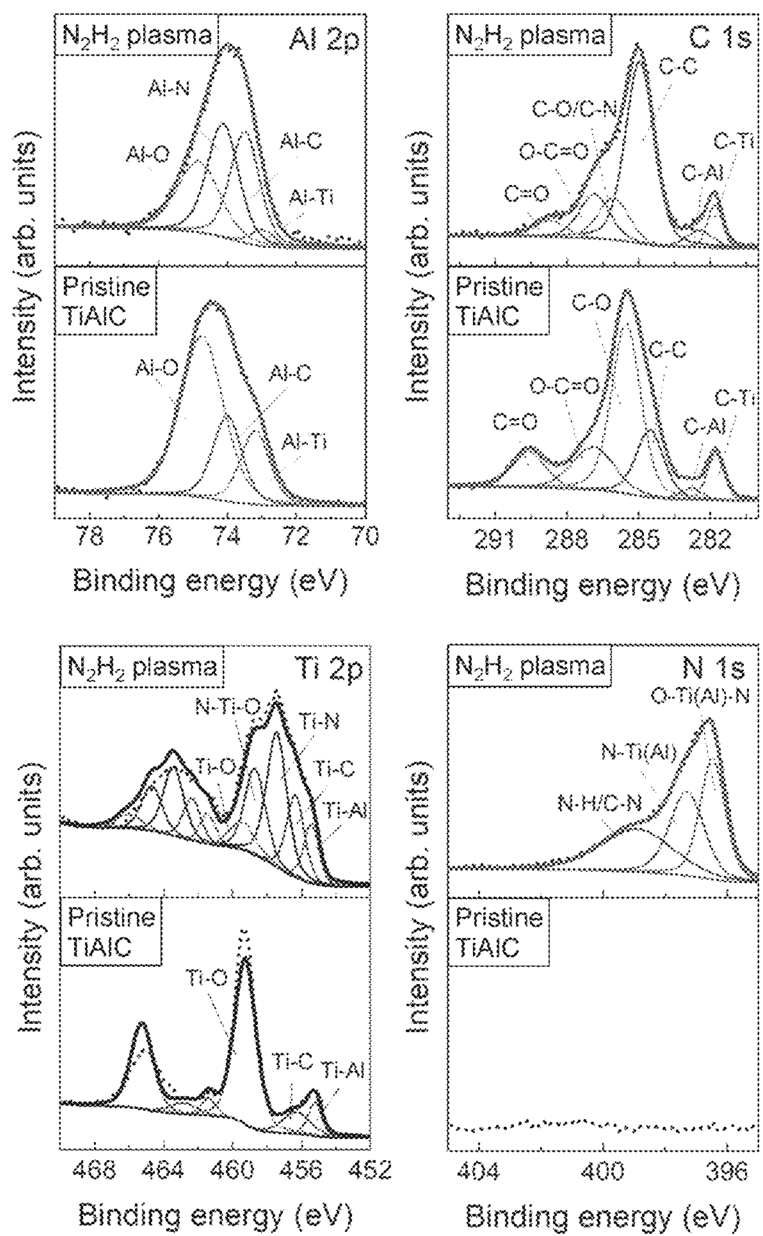
FIG. 11 is a view illustrating narrow scans for core regions of Al 2p, C 1 s, Ti 2p, and N is in X-ray photoelectron spectra obtained on the surface of TiAlC film before and after the mixture of $H_2$ and $N_2$ with flow rates of 50 and 50 sccm, bias power of 200 W, at pressure of 2 Pa, and treatment time for 5 min.

FIG. 11 is a view illustrating narrow scans for core regions of Al 2p, C is, Ti 2p, and N is in X-ray photoelectron spectra obtained on the surface of TiAlC film before and after the mixture of $H_2$ and $N_2$ with flow rates of 50 and 50 sccm, bias power of 200 W, at pressure of 2 Pa, and treatment time for 5 min.

Figure 12:
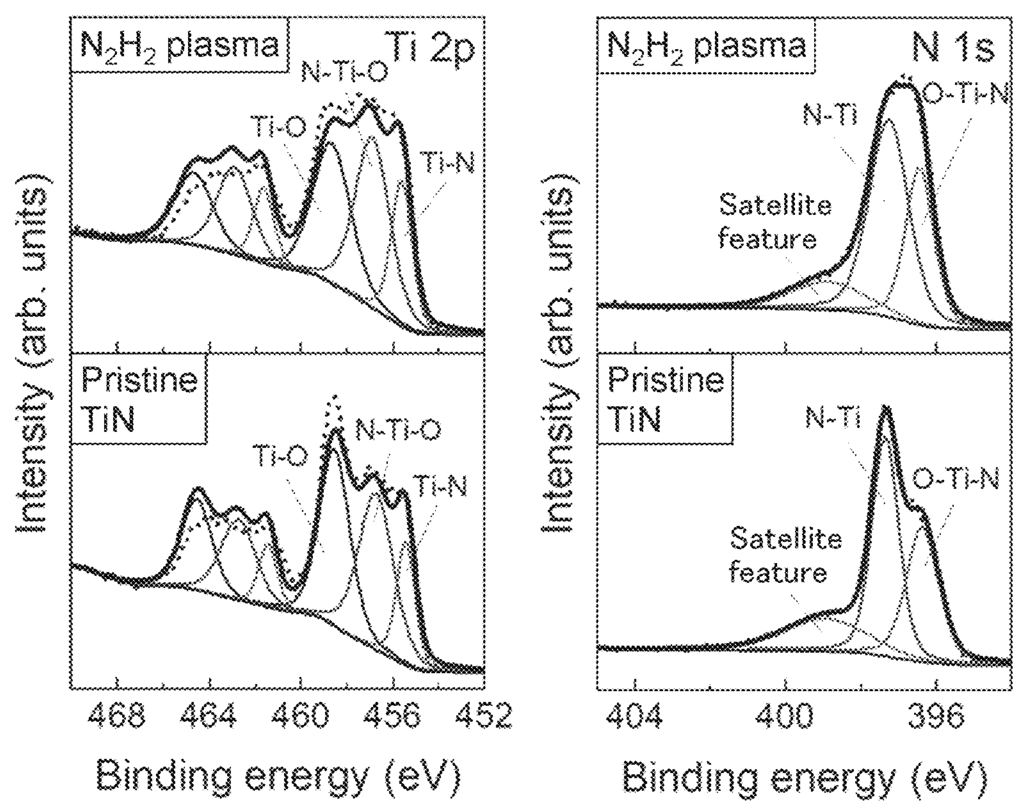
FIG. 12 is a view illustrating narrow scans for core regions of Ti 2p, and N is in X-ray photoelectron spectra obtained on the surface of TiN film before and after the mixture of $H_2$ and $N_2$ with flow rates of 50 and 50 sccm, bias power of 200 W, at pressure of 2 Pa, and treatment time for 5 min.

FIG. 12 is a view illustrating narrow scans for core regions of Ti 2p, and N 1 s in X-ray photoelectron spectra obtained on the surface of TiN film before and after the mixture of $H_2$ and $N_2$ with flow rates of 50 and 50 sccm, bias power of 200 W, at pressure of 2 Pa, and treatment time for 5 min.

For TiAlC films, chemical shifts of TiN and AlN are appeared after the plasma etching process, indicating nitridation of TiAlC film. In N is, there are three or more components. The two components can be assignable for AlN and TiN and the residual parts are identified to chemical shifts due to bind hydrogen and carbon, indicating to NH and CN bonds.

For TiN films, chemical shifts for TiN are appeared before and after the plasma etching process. Peak features are almost not changed after the plasma etching process.

Figure 13:
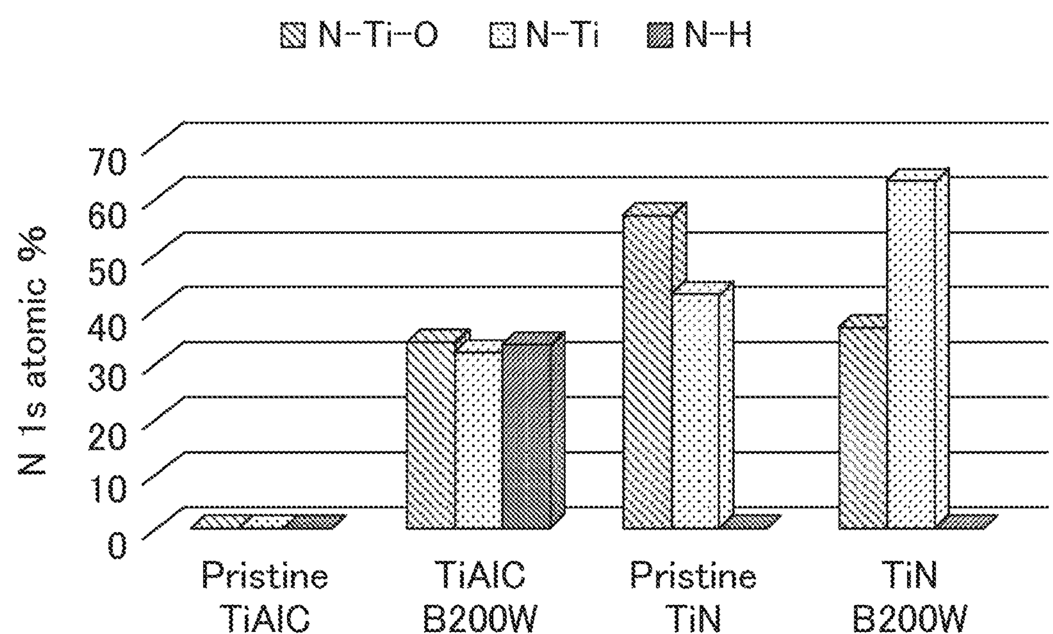
FIG. 13 is a view illustrating summaries of elemental ratio and peak composition for the chemical shifts in the XPS analyses of the representative conditions.

FIG. 13 is a view illustrating summaries of elemental ratio and peak composition for the chemical shifts in the XPS analyses of the representative conditions.

Figure 14:
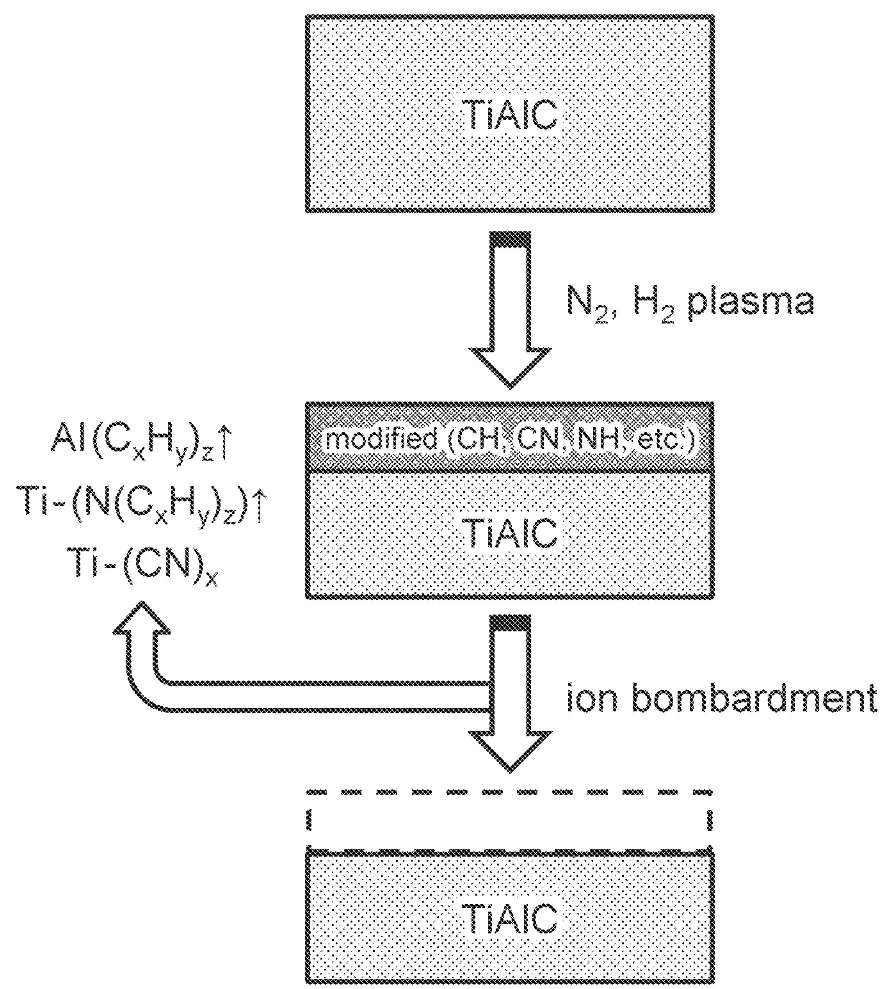
FIG. 14 is a cross-sectional view of selective plasma etching of TiAlC using $N_2/H_2$ plasma.

Etching mechanism is as follows. NH bonding can be formed in the carbides. Hydrocarbon groups are bound to metal elements, in this setup. Ti and Al are centered by coordination of the hydrocarbon groups via bridging nitrogen. These metalorganic complexes can be desorbed by forming volatile products. This shows potential of producing volatile products such as $Al(C_xH_y)_z$, Ti—$(N(C_xH_y)_z)$, and Ti—$(CN)_x$. The cross-sectional view of the selective plasma etching of TiAlC is shown in FIG. 14.

Here, although this example describes application of this invention to an anisotropic etching, this invention is also applicable to isotropic etching by using heating instead of ion irradiation.

Example Process 2

A second embodiment will be described with reference to FIG. 15.

The description will be given of an example in development of a dry plasma etching of titanium aluminum carbide film on titanium nitride film on a silicon wafer.

Figure 15:
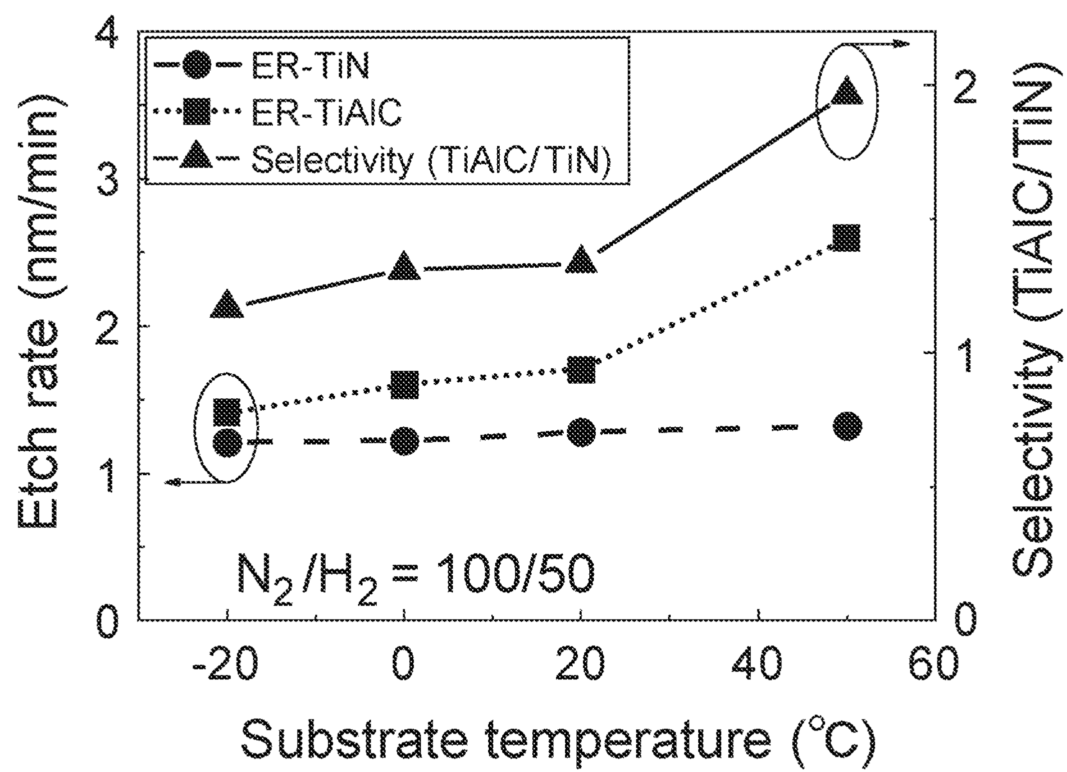
FIG. 15 is a view illustrating dependence of TiAlC and TiN etching rates on substrate temperature range is from −20 to 50° C. Plasma of a mixture of $N_2$ and $H_2$ with flow rates of 100 and 50 sccm, respectively. Bias power of 200 W is applied and a pressure is at 4 Pa.

FIG. 15 is a view illustrating dependence of TiAlC and TiN etching rates on substrate temperature range is from −20 to 50° C. Plasma of a mixture of $N_2$ and $H_2$ with flow rates of 100 and 50 sccm, respectively. Bias power of 200 W is applied and a pressure is at 4 Pa.

In this setup, the etching rates and selectivity of TiAlC over TiN films become to increase with increasing the substrate temperature above 20° C.

Example Process 3

A third embodiment will be described with reference from FIG. 16 to FIG. 19B.

The description will be given of an example in development of a dry plasma etching of titanium aluminum carbide film on titanium nitride film on a silicon wafer.

Figure 16:
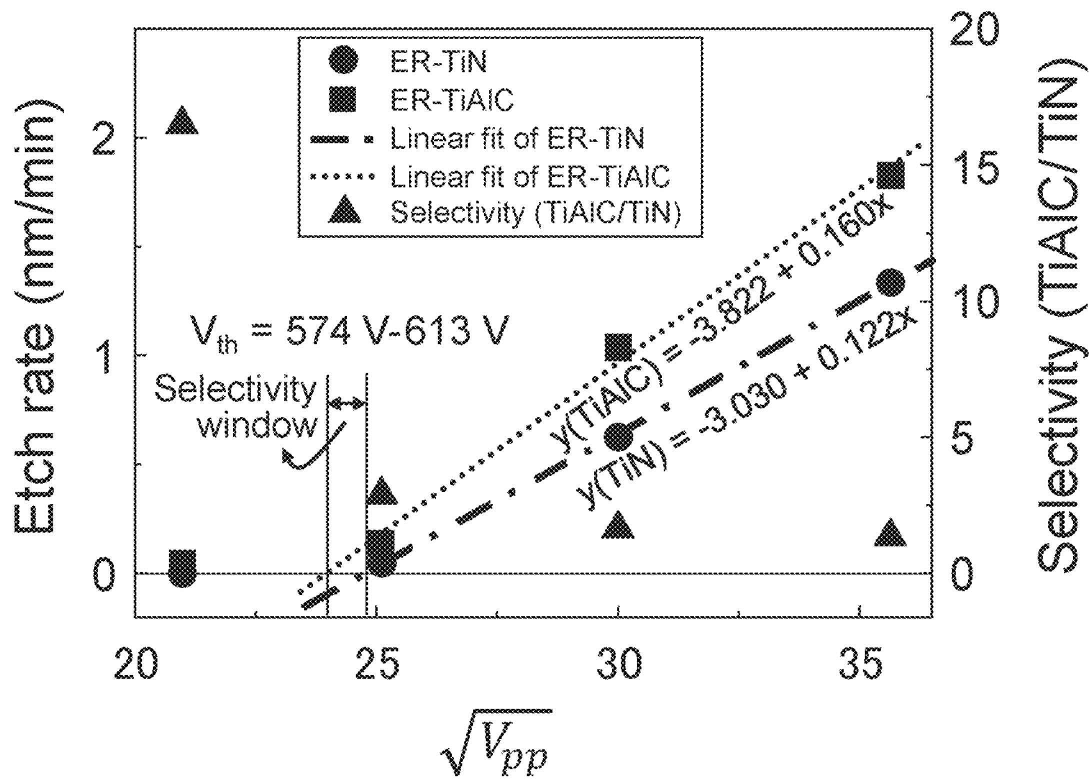
FIG. 16 is a view illustrating dependence of TiAlC and TiN etching rates on bias powers range is from 25 to 200 W. Plasma of a mixture of $N_2$ and $H_2$ with flow rates of 50 and 50 sccm, respectively. Excitation VHF power of 300 W is applied and a working pressure is at 2 Pa.

FIG. 16 is a view illustrating dependence of TiAlC and TiN etching rates on bias powers range is from 25 W to 200 W. Plasma of a mixture of $N_2$ and $H_2$ with flow rates of 50 and 50 sccm, respectively. Excitation VHF power of 300 W is applied and a working pressure is at 2 Pa. The bias powers covert to squared root of the peak-to-peak voltage, Vpp. At the same bias power, the TiAlC etch rates are higher than the TiN etch rates at the larger Vpp. The trends are fitted by linear correlation of etch rates with Vpp. The crossing values (threshold) for zero in etching rate are found to be lower in the TiAlC etching rates than those in the TiN etching rates. In the cases of lower bias power than the threshold, highly selective removal of TiAlC over TiN films can be possible.

Figure 17:
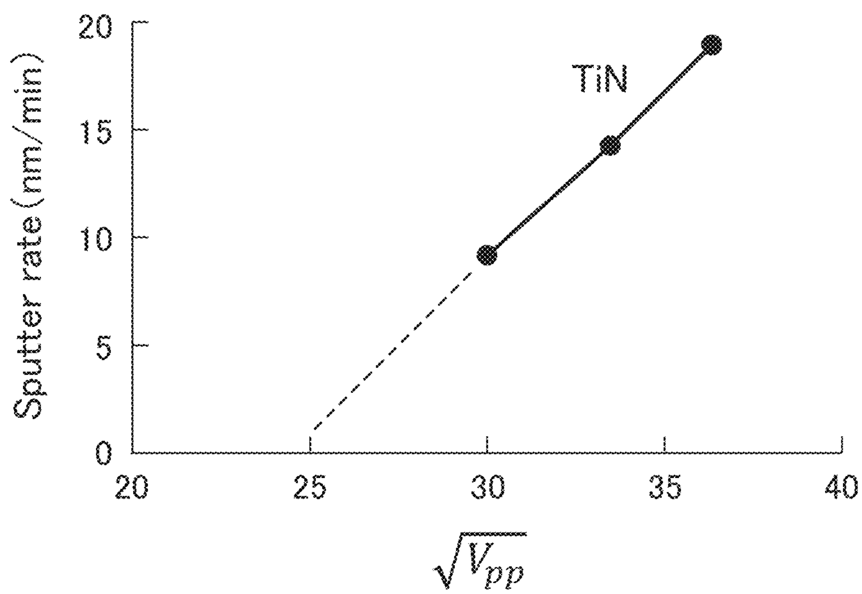
FIG. 17 is a view illustrating dependence of TiN sputter rates on $\sqrt{Vpp}$ for a Vpp range from 900 and 1300 Vpp. Plasma of Ar with flow rate of 50 sccm at pressure at 1 Pa.
Figure 18:
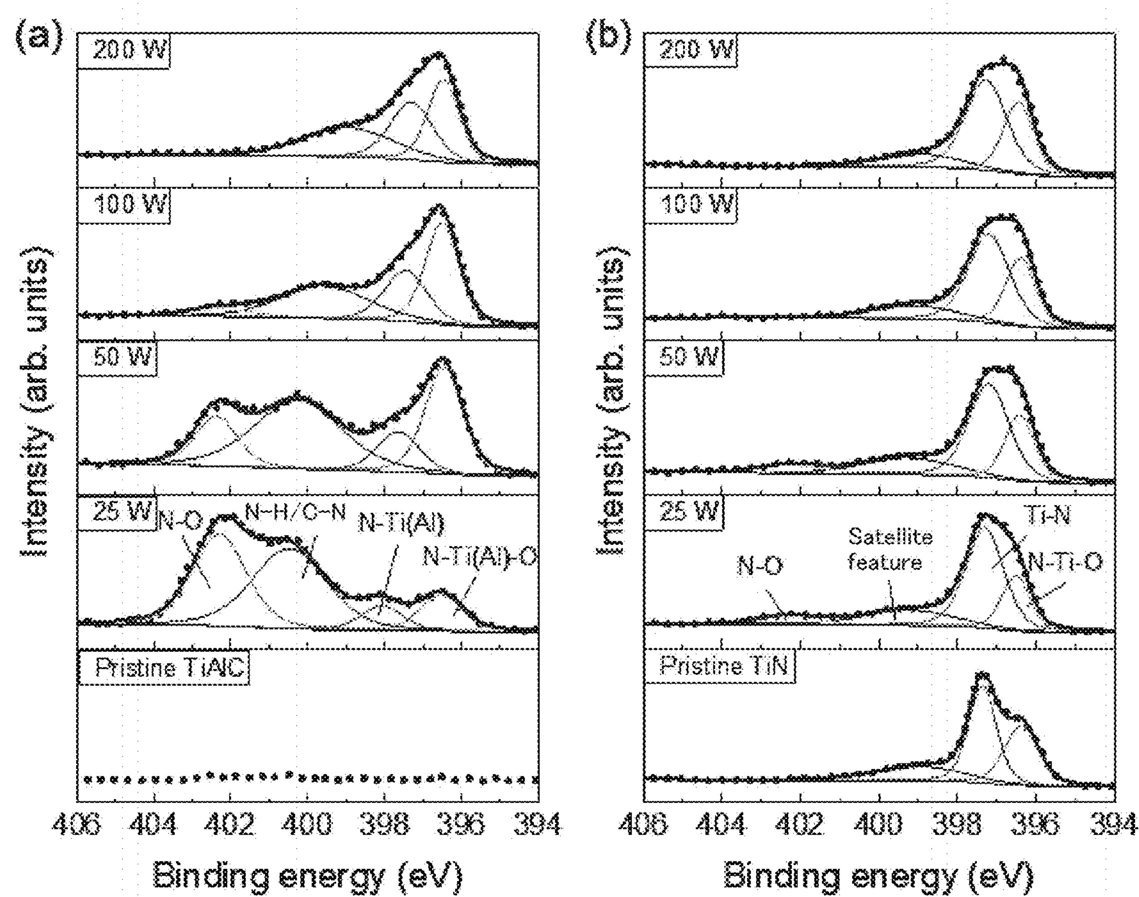
FIGS. 18A and 18B are narrow scans for core region of N is in X-ray photoelectron spectra obtained on the surfaces of TiAlC and TiN films before and after the mixture of $H_2$ and $N_2$ with flow rates of 50 and 50 sccm, with various bias powers of 25, 50, 100, and 200 W, at pressure of 2 Pa, a substrate temperature at 20° C. Treatment time for the sample using bias power at 200 W is 5 min, and for others is 20 min.
Figure 19:
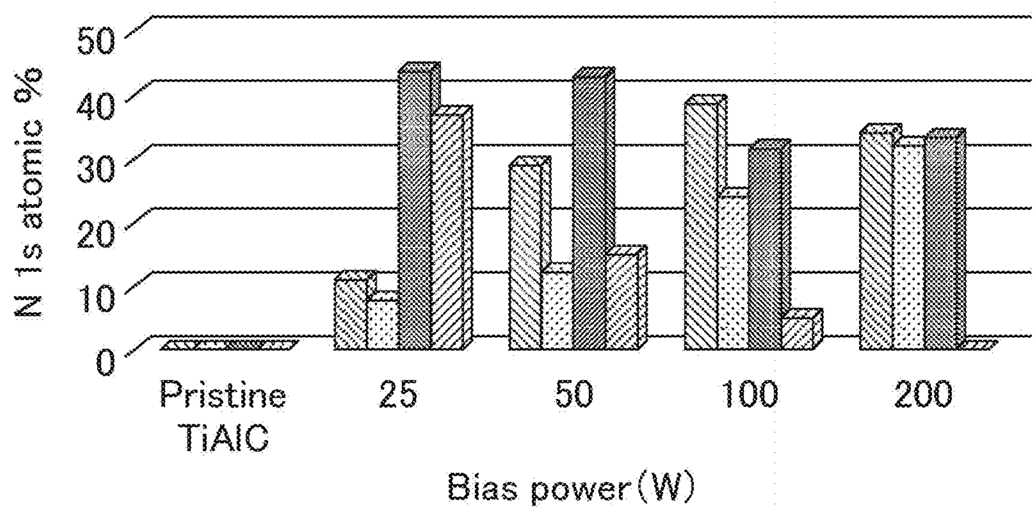
FIGS. 19A and 19B are views illustrating summaries of elemental ratio and peak composition for the chemical shifts in the XPS analyses of the representative conditions.
Figure 19:
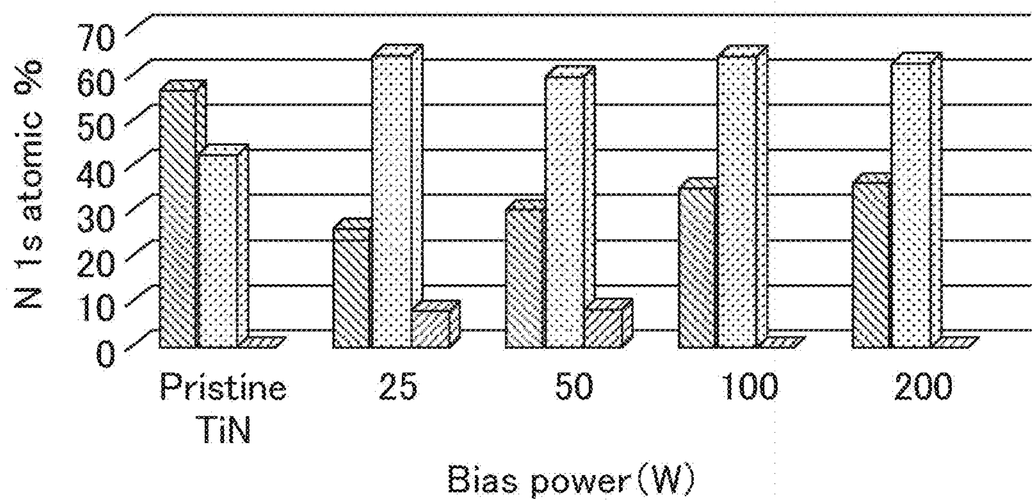

FIG. 17 is a view illustrating dependence of TiN sputter rates on √Vpp for a Vpp range from 900 and 1300 Vpp. Plasma of Ar with flow rate of 50 sccm at pressure at 1 Pa. The trends are fitted by linear correlation of the TiN sputter rates with √Vpp. The crossing values (threshold) for zero in sputter rate are found to be almost same at √Vpp of 25 for the TiN etch rates in $H_2$ and $N_2$ mixture plasma. However, the TiAlC trend is not follow to the physical sputter one. In the other word, the physical sputter rates are not able to trace out this invention's results, which are obtained in the $N_2$ and $H_2$ mixture plasma and low bias power application. This means that the $N_2$ and $H_2$ chemistry play a vital role for selective etching of TiAlC over TiN.

FIGS. 18A and 18B are narrow scans for core region of N is in X-ray photoelectron spectra obtained on the surfaces of TiAlC and TiN films before and after the mixture of $H_2$ and $N_2$ with flow rates of 50 and 50 sccm, with various bias powers of 25, 50, 100, and 200 W, at pressure of 2 Pa, a substrate temperature at 20° C. Treatment time for the sample using bias power at 200 W is 5 min, and for others is 20 min.

For TiN films, before the plasma etching, there are two components of chemical shifts in N is regions. One is assigned for bulk TiN and the other is for native oxide of TiN film, indicating TiON. At the binding energy around 402 eV, a small feature is observed in particular for low bias powers of 25 W and 50 W. This is identified to NO bond.

For TiAlC films, before the plasma etching, there is surely no nitrogen. This pristine TiAlC films are etched and the obvious peaks are appeared in the N 1 s XPS spectra. Similarly in the TiN films, there are components for TiN and AlN and for native oxides of TiON and AlON. At higher than 50 W of the bias power, these peaks are almost unchanged independent on the bias powers. In the case of low bias powers of 25 W and 50 W, the peak components of high binding energy around 402 eV become large in intensity. The observed modification on the TiAlC surface causes to form volatile products in the $N_2$ and $H_2$ mixture plasma. The bonds Al—C, Ti(Al)—N, N—H and C—N were found in the plasma treated sample, this is a proof of forming volatile products having chemical bonds including methyl (Al—$CH_3$), methylamine (Ti(Al)—$NH_n$—$CH_{3-n}$). These bonding components should be controlled to obtain volatile products.

FIGS. 19A and 19B are views illustrating summaries of elemental ratio and peak composition for the chemical shifts in the XPS analyses of the representative conditions.

Example Process 4

A fourth embodiment will be described with reference from FIG. 20 to FIG. 23.

The description will be given of an example in development of a dry plasma etching of titanium aluminum carbide film on titanium nitride film on a silicon wafer.

Figure 20:
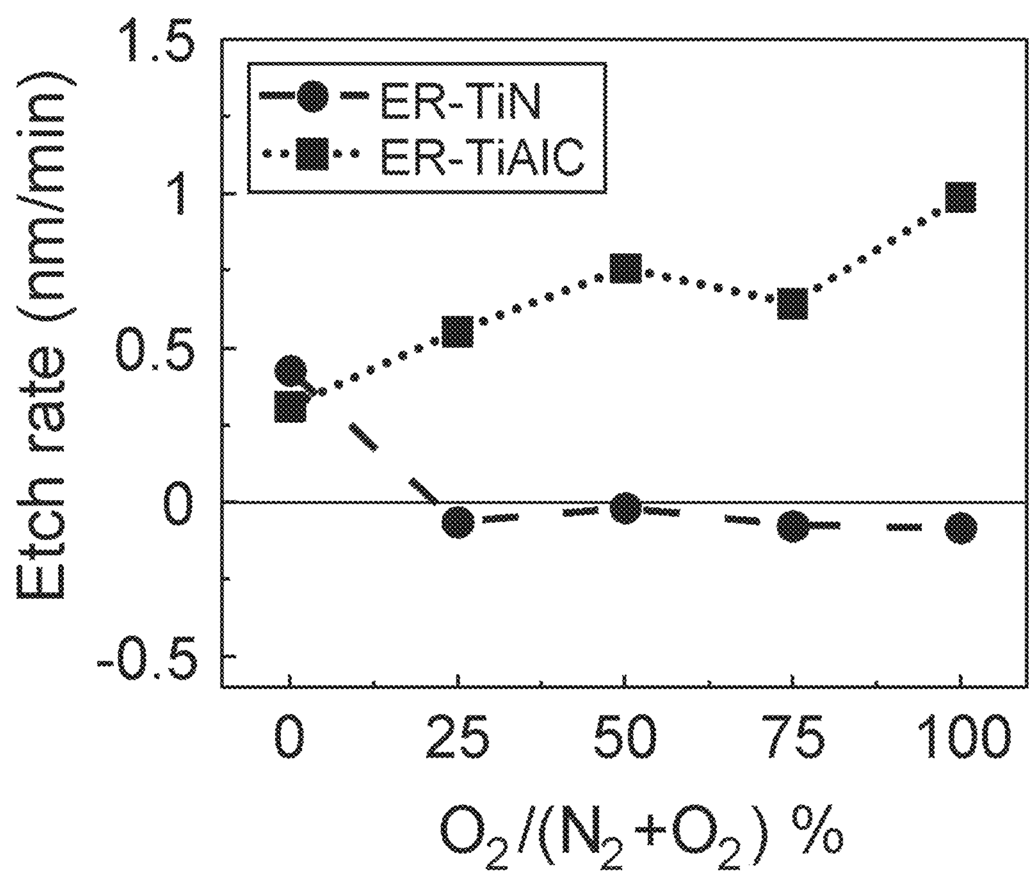
FIG. 20 is a view illustrating of dependence of etch rates of TiAlC as a function of fraction of $O_2$ in a mixture of $O_2$ and $N_2$ gases at pressure of 2 Pa, bias power of 200 W, and substrate temperature at 20° C. For reference, a dependence of TiN etch rates is also shown.

FIG. 20 is a view illustrating of dependence of etch rates of TiAlC as a function of fraction of $O_2$ in a mixture of $O_2$ and $N_2$ gases at pressure of 2 Pa, bias power of 200 W, and substrate temperature at 20° C. For reference, a dependence of TiN etch rates is also shown.

Figure 21:
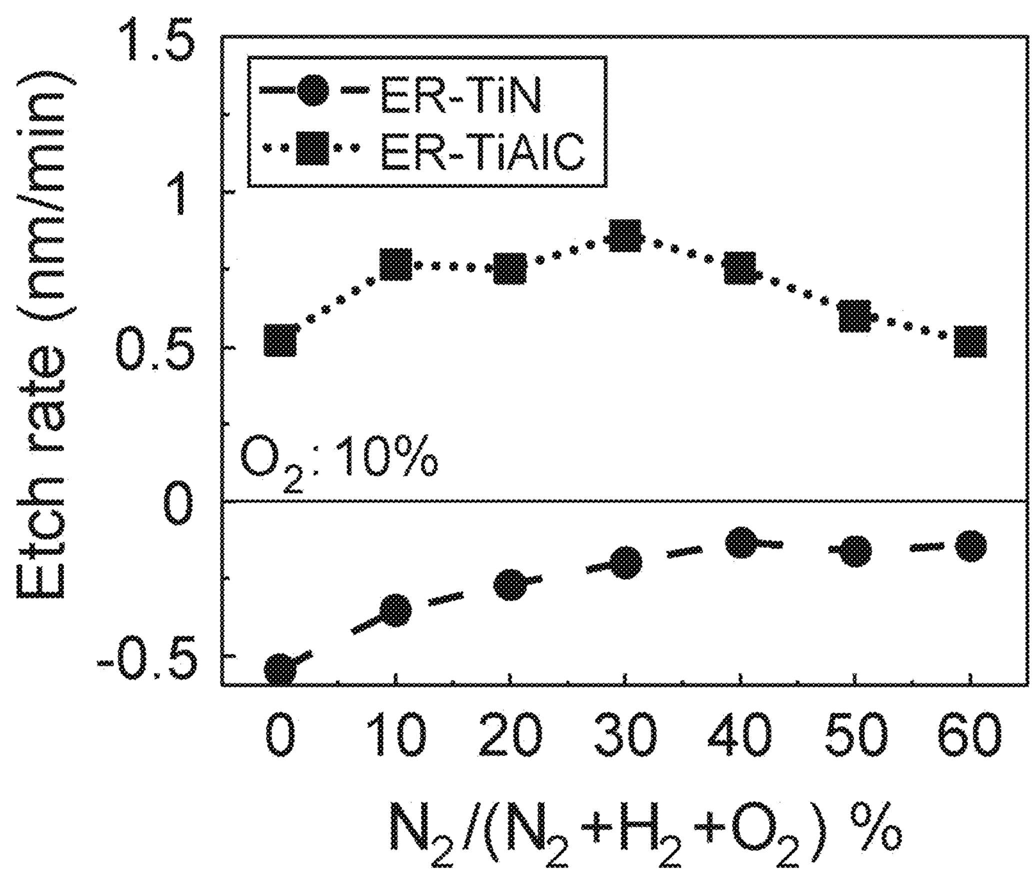
FIG. 21 is a view illustrating of dependence of etch rates of TiAlC as a function of fraction of $N_2$ in a mixture of $H_2$, and $N_2$ gases added with 10% $O_2$ at pressure of 2 Pa, bias power of 200 W, and substrate temperature at 20° C. For reference, a dependence of TiN etch rates is also shown.

FIG. 21 is a view illustrating of dependence of etch rates of TiAlC as a function of fraction of $N_2$ in a mixture of $H_2$, and $N_2$ gases added with 10% $O_2$ at pressure of 2 Pa, bias power of 200 W, and substrate temperature at 20° C. For reference, a dependence of TiN etch rates is also shown.

Figure 22:
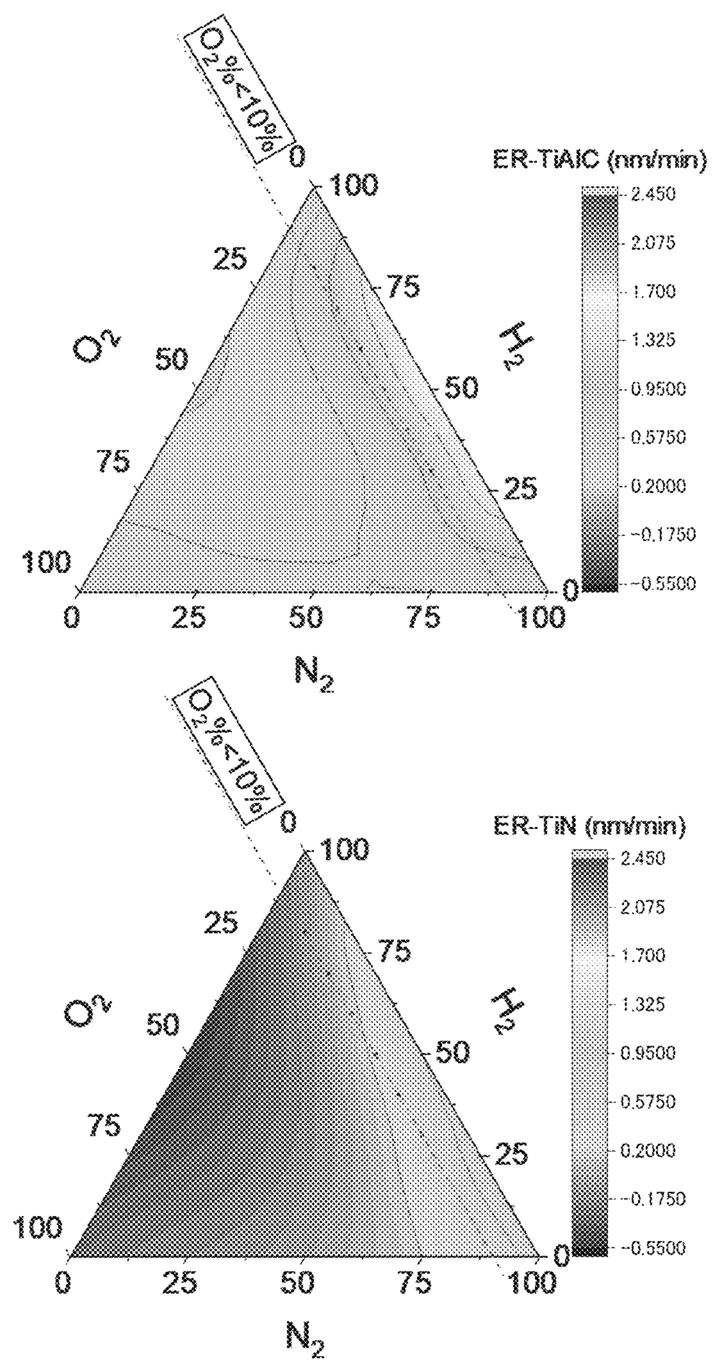
FIG. 22 is a view illustrating of contours of TiAlC and TiN etch rates as functions of fraction of $N_2$, $O_2$, and $H_2$ in a mixture of $H_2$, $O_2$, and $N_2$ gases at a pressure of 2 Pa, bias power of 200 W, and substrate temperature at 20° C.

FIG. 22 is a view illustrating of contours of TiAlC and TiN etch rates as functions of fraction of $N_2$, $O_2$, and $H_2$ in a mixture of $H_2$, $O_2$, and $N_2$ gases at a pressure of 2 Pa, bias power of 200 W, and substrate temperature at 20° C.

For TiAlC films, two maxima are appeared. One is at $O_2$ and $N_2$ mixture plasma and the other is at $N_2$ and $H_2$ mixture plasma. In the cases of $N_2$ and $H_2$ mixture, $O_2$ addition less than 10% obtains almost same etch rates of TiAlC. Further addition of $O_2$ decreases the TiAlC etch rates significantly, but still etch rates are relatively high.

For TiN films, a maximum in the etch rates is appeared at pure $N_2$ in this mixture among $O_2$, $H_2$ and $N_2$. In the case of $O_2$ addition, surface oxidation significantly suppresses to etch the TiN film off.

To gain etch selectivity of TiAlC over TiN and high etching rate of TiAlC films, a mixture of $H_2$ and $N_2$ with $H_2$ fractions ranged from 25% to 75% is the best examples, and $O_2$ should be added in the $H_2$ and $N_2$ mixture less than 10% fraction of $O_2$.

Figure 23:
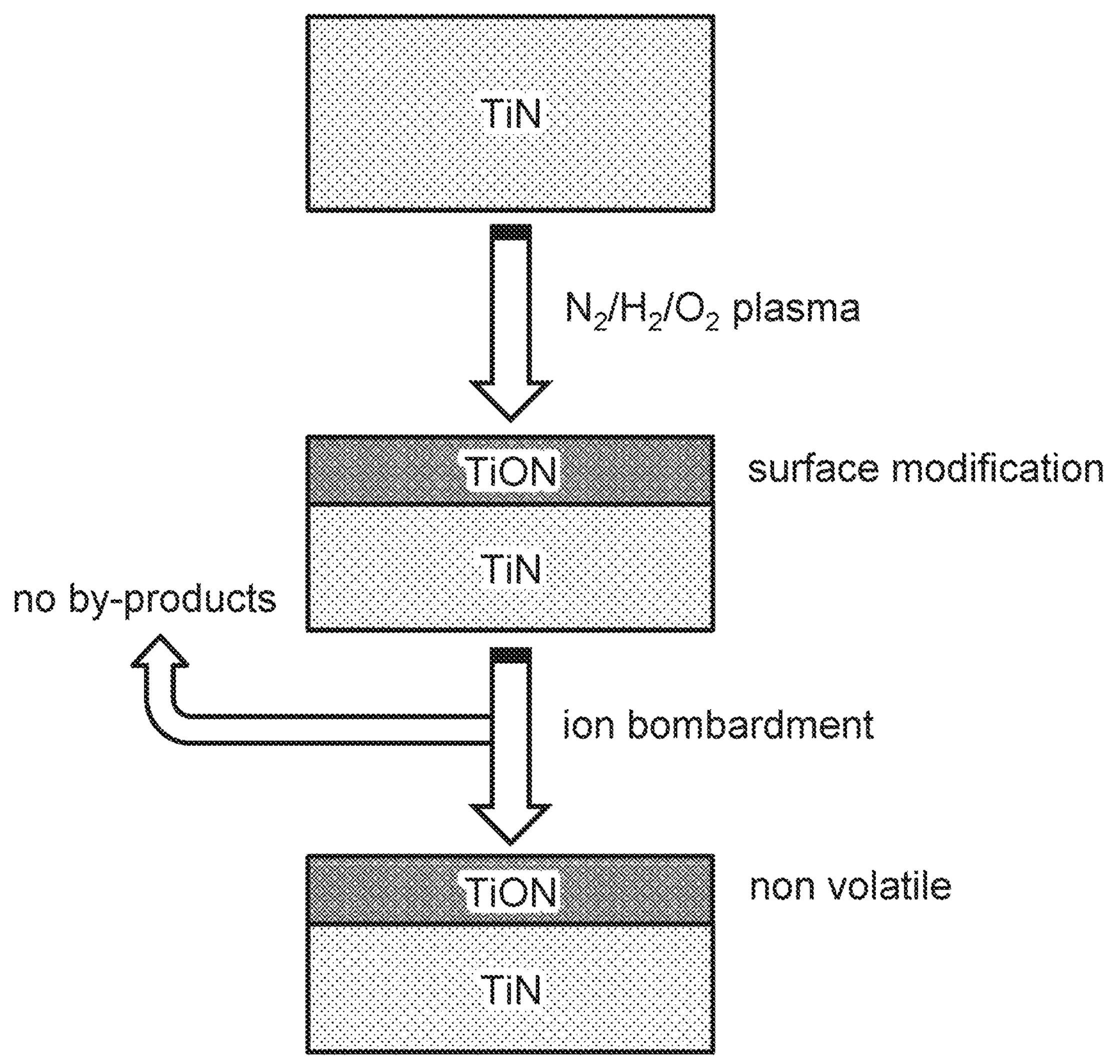
FIG. 23 is a cross-sectional view of suppression of etching of TiN in $N_2/H_2/O_2$ plasma.

According to the etching results of the present invention, surface modification of each TiAlC and TiN films can be controlled by plasma etching chemistry that means a control of gas mixture ratios. The plasma generates various kinds of ions and radicals. Mainly, surface modification of NH and CN components can assist to remove the TiAlC films. This modified layer is potential to form volatile products such forms that hydrocarbon groups bind with nitrogen bridge to coordinate Ti and Al centers. Small amounts of oxidations of both the films can assist to suppress the etching of TiN films by forming TiON. Cross-sectional view of suppression of etching of TiN in $N_2/H_2/O_2$ plasma is shown in FIG. 23.

Example Process 5

Figure 24:
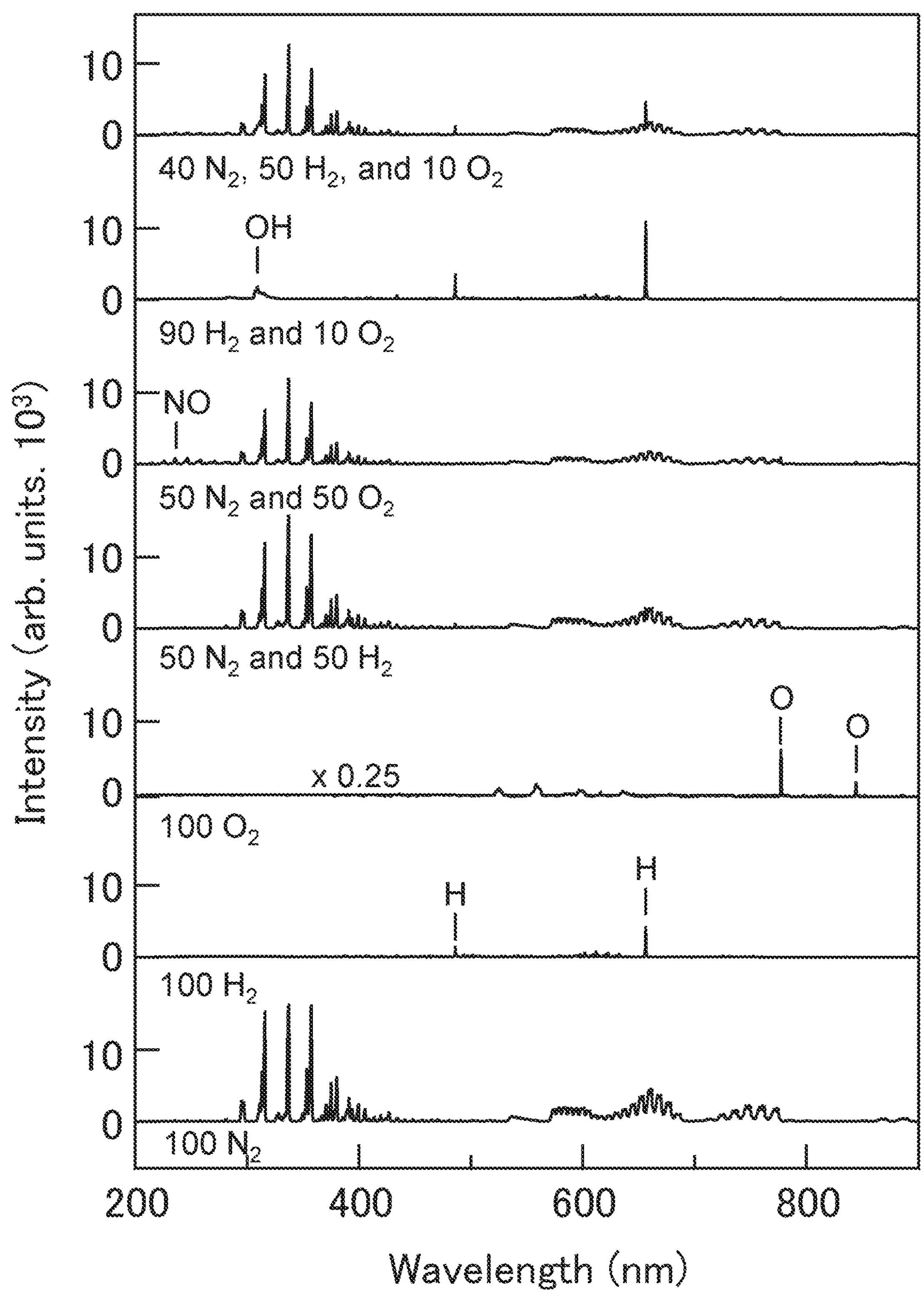
FIG. 24 is a view illustrating optical emission spectra of plasmas obtained by the various mixtures of $N_2$, $O_2$, and $H_2$ at pressure of 2 Pa.
Figure 25:
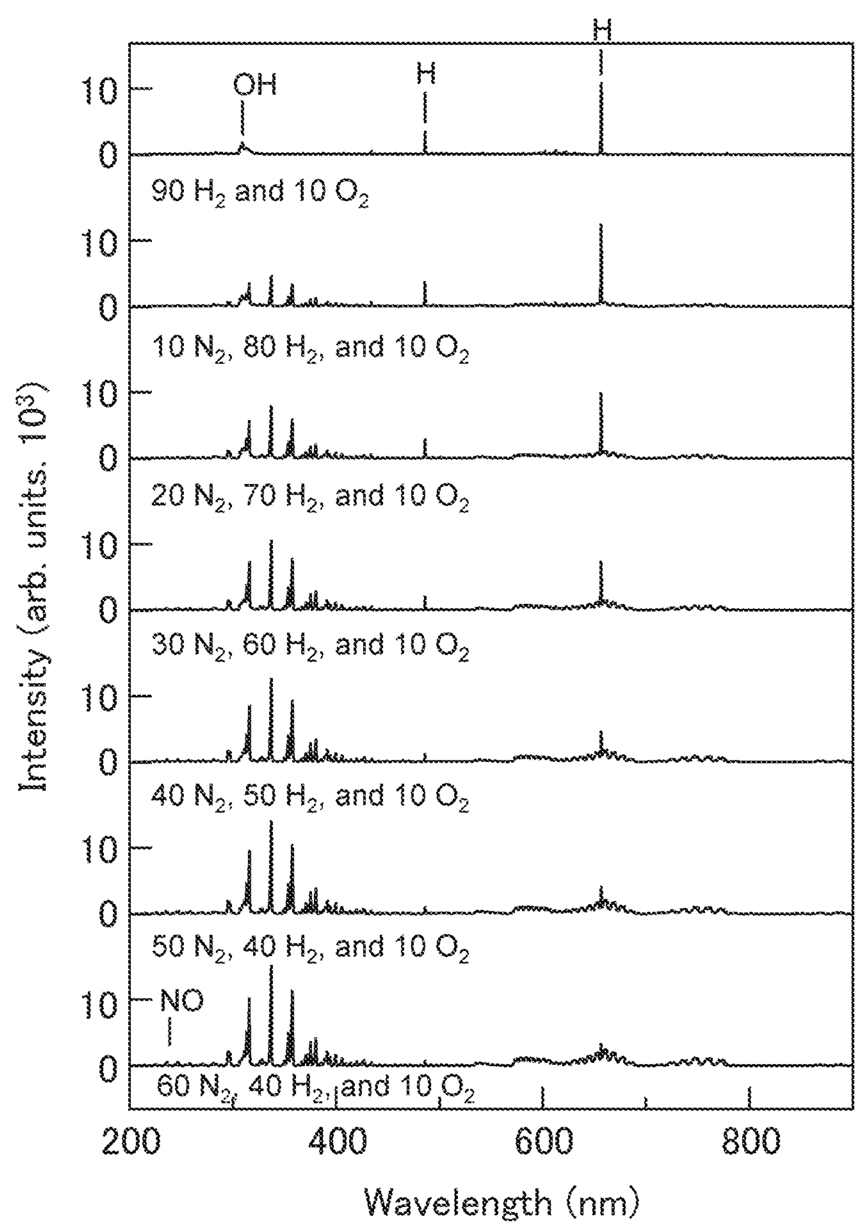
FIG. 25 is a view illustrating optical emission spectra of plasmas obtained by the various mixtures of $N_2$, $O_2$, and $H_2$ at pressure of 2 Pa.

FIGS. 24, and 25 are a view illustrating optical emission spectra of plasmas obtained by the various mixtures of $N_2$, $O_2$, and $H_2$ at pressure of 2 Pa. In the 100% $N_2$, the second positive system for $N_2$ around 337, 357, and 380 nm, the first positive system for $N_2$ around 600 to 800 nm are clearly observed. In the 100% $H_2$, Balmer lines for H atom at 656.3 nm and 486.1 nm are clearly observed. In the 100% $O_2$, O atom emission at 777 and 844 nm are seen. In the $N_2$ and $H_2$ mixture, NH emission can be observed, however overlaps of the $N_2$ emissions disturb to observe the NH band in this setup. In the $N_2$ and $O_2$ mixture, NO emission around 245 nm can be observed at ultraviolet range. In the $H_2$ and $O_2$ mixture, intense OH emission around 310 nm and H Balmer lines are clearly seen. In the $N_2$, $H_2$, and 10% $O_2$ mixture, all emissions from NO and H atom are overlapped. Then, the use of optical emission spectral observation can be used to monitor this condition, how mix the gases. In addition, when $O_2$ is fixed at 10%, the balance of $N_2$ and $H_2$ is changed. The spectral intensities of H atom (656 nm), $N_2$ (337 nm), OH (310 nm), and NO (245 nm), indicate how these gases mix in the plasma.

Example Process 6

Figure 26:
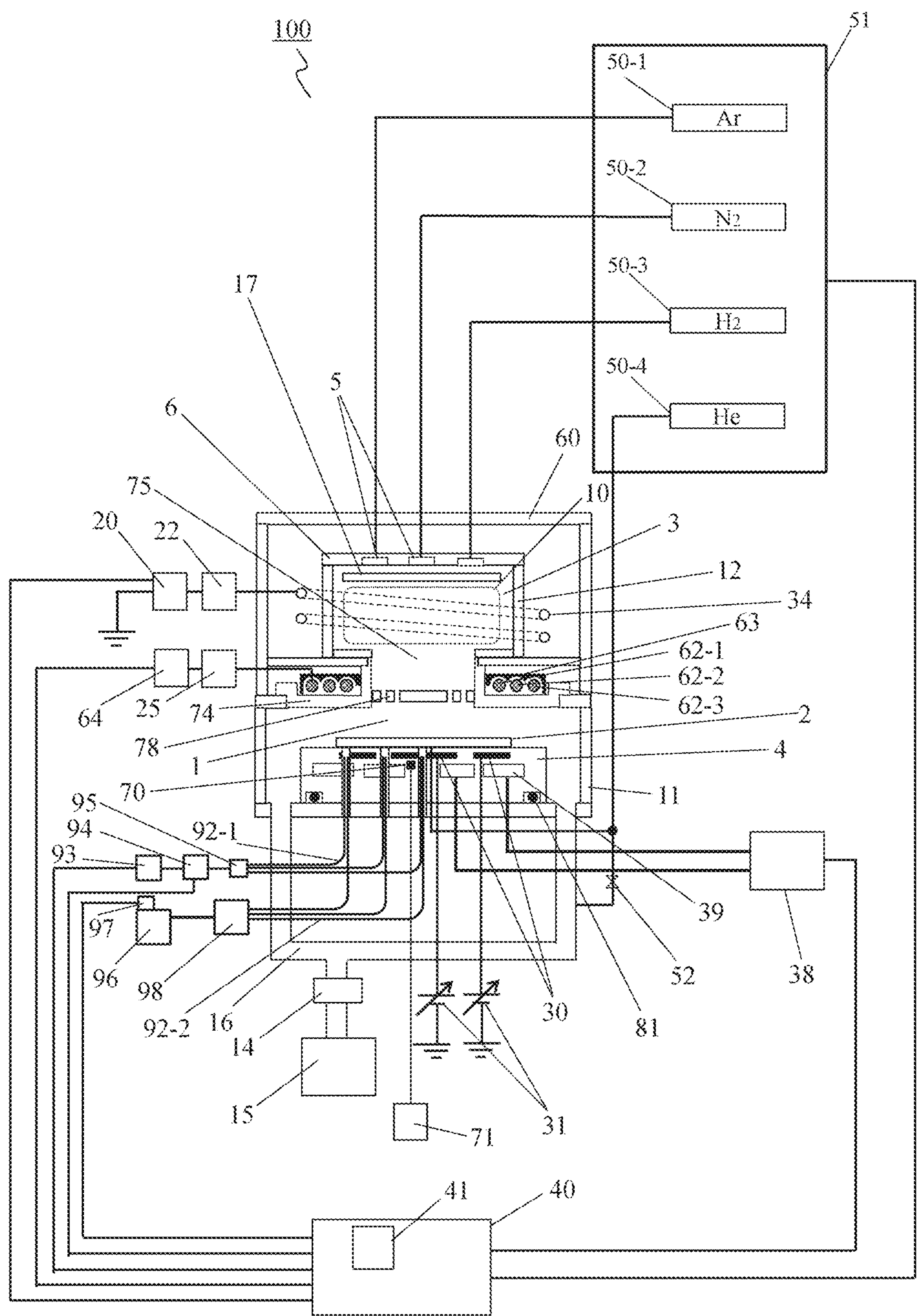
FIG. 26 is a view illustrating schematic cross-section of an apparatus for isotropic etching according to an embodiment of the invention.

Description will be given of an embodiment with reference to FIG. 26 and FIG. 27. This embodiment corresponds to an example in which plasma generated from a mixture of $N_2$ and $H_2$ are used, and a TiAlC film on a TiN film is selectively, and isotropically etched by using infrared heating in a plasma processing apparatus for a 300-mm wafer.

The plasma processing apparatus that performs etching of the film containing titanium aluminum carbide as described above will be described. FIG. 26 is a sectional view illustrating a schematic configuration of a plasma processing apparatus 100.

A processing chamber 1 is configured with a base chamber 11; a wafer stage 4 (hereinafter, referred to as stage 4) on which a wafer 2 serving as a sample to be processed is placed is disposed in the processing chamber 1. A plasma source, which includes a quartz chamber 12, an ICP coil 34, and a high frequency electric power supply 20, is disposed in a container 60 disposed above the base chamber 11. In the example, an inductively coupled plasma (ICP) electric discharge method is used for the plasma source. The high frequency electric power supply 20 that generates plasma is connected to the ICP coil 34 outside the cylindrical quartz chamber 12 via a matching unit 22. A frequency band of tens of MHz, such as 13.56 MHz, is used as a frequency of high frequency electric power.

A top plate 6 is disposed at an upper portion of the quartz chamber 12. Shower plates 5 are disposed in the top plate 6. A gas dispersion plate 17 is disposed below the top plate 6. The processing gas is introduced into the processing chamber 1 from an outer periphery of the gas dispersion plate 17.

A supply flow rate of the processing gas is adjusted by mass flow controllers 50 disposed for each type of gas in the processing gas. FIG. 26 illustrates an example of using $N_2$, and $H_2$ as the processing gas. However, gas types in the processing gases are not limited thereto.

A vacuum exhaust pipe 16 is connected to a pump 15 to reduce pressure at a lower portion of the processing chamber 1. The pump 15 is configured with, for example, a turbo molecular pump, a mechanical booster pump, or a dry pump. In order to adjust pressure of an electric discharge region 3 in the processing chamber 1 or the quartz chamber 12, a pressure adjustment mechanism 14 is disposed upstream of the pump 15. The pressure adjustment mechanism 14, the pump 15, and the vacuum exhaust pipe 16 are collectively referred to as an exhaust mechanism. The stage 4 is provided with an O-ring 81 that performs vacuum-sealing between the stage 4 and a bottom surface of the base chamber 11.

An infrared (IR) lamp unit that heats the wafer 2 is disposed between the stage 4 and the quartz chamber 12 that constitutes the ICP plasma source. The IR lamp unit mainly includes an IR lamp 62, a reflection plate 63 that reflects IR light, and an IR light transmission window 74. A circular (round-shaped) lamp is used as the IR lamp 62. Light (electromagnetic wave) emitted from the IR lamp 62 is light (herein referred to as IR light) mainly including light from visible light to light in an infrared light region. In the example, the IR lamp 62 includes IR lamps 62-1, 62-2, and 62-3 for three rounds. However, the IR lamp 62 may include IR lamps for two or four rounds. The reflection plate 63 that reflects the IR light downward (in a placement direction of the wafer 2) is disposed above the IR lamp 62.

An IR lamp electric power supply 64 is connected to the IR lamp 62. A high frequency cut-off filter 25 is disposed between the IR lamp electric power supply 64 and the IR lamp 62. The high frequency cut-off filter 25 prevents noise of high frequency electric power for generating plasma produced by the high frequency electric power supply 20 from flowing into the IR lamp electric power supply 64. The IR lamp electric power supply 64 has a function of independently controlling electric power supplied to the respective IR lamps 62-1, 62-2 and 62-3, so that radial distribution of a heating amount of the wafer 2 can be adjusted.

In the example, a gas flow path 75 is formed in a center of the IR lamp unit since the gas supplied into the quartz chamber 12 flows into the processing chamber 1. The gas flow path 75 is provided with a slit plate (ion shielding plate) 78 that shields ions and electrons in the plasma generated inside the quartz chamber 12 and that transmits only a neutral gas or neutral radicals to irradiate the wafer 2. The slit plate 78 includes a plurality of holes.

On the other hand, a refrigerant flow path 39 is formed in the stage 4 to cool the stage 4; a refrigerant is supplied and circulated by a chiller 38. In order to fix the wafer 2 to the stage 4 by electrostatic attraction, electrodes 30 for electrostatic attraction, which are plate-shaped electrode plates, are embedded in the stage 4. DC electric power supplies 31 for electrostatic attraction are respectively connected to the electrodes 30 for electrostatic attraction.

In order to efficiently cool the wafer 2, a He gas (cooling gas) can be supplied between the stage 4 and a back surface of the wafer 2 placed on the stage 4. A surface (a placement surface of the wafer) of the stage 4 is coated with resin such as polyimide to prevent the back surface of the wafer 2 from being damaged even when the electrodes 30 for electrostatic attraction are operated to perform heating and cooling while the wafer 2 is electrostatically attracted. A thermocouple 70 that measures a temperature of the stage 4 is disposed inside the stage 4 and is connected to a thermocouple thermometer 71.

Optical fibers 92-1 and 92-2 are disposed at three places to measure temperatures of the wafer 2, that is, a place near a center portion of the wafer 2 placed on the stage 4, a place near a middle portion of the wafer 2 in a radial direction, and a place near an outer periphery of the wafer 2. The optical fiber 92-1 guides the IR light from an external IR light source 93 to the back surface of the wafer 2, so that the back surface of the wafer 2 is irradiated with the IR light. On the other hand, the optical fiber 92-2 collects the IR light transmitted through or reflected on the wafer 2 among the IR light emitted by the optical fiber 92-1, and transmits the transmitted or reflected IR light to a spectroscope 96.

That is, the external IR light generated by the external IR light source 93 is transmitted to an optical path switch 94 that turns on and off an optical path. Thereafter, the external IR light is branched into a plurality of pieces of light (three in this case) by a light distributor 95, and various positions on the back surface of the wafer 2 are irradiated with the plurality of pieces of IR light via three optical fibers 92-1. The IR light absorbed or reflected by the wafer 2 is transmitted to the spectroscope 96 by the optical fiber 92-2 and data of wavelength dependency of a spectral intensity is obtained by a detector 97. The data of the wavelength dependency of the spectral intensity obtained by the detector 97 is sent to an arithmetic unit 41 of a control unit 40 to calculate an absorption wavelength, and the temperature of the wafer 2 can be determined based on the absorption wavelength. An optical multiplexer 98 is disposed on an intermediate portion of the optical fiber 92-2, so that it is possible to switch light to be subjected to spectroscopic measurement at measurement points of the center of the wafer, the middle of the wafer, and the outer periphery of the wafer. Accordingly, the arithmetic unit 41 can determine the respective temperatures of the center of the wafer, the middle of the wafer, and the outer periphery of the wafer.

The control unit 40 controls each mechanism that constitutes the plasma processing apparatus 100. Specifically, the control unit 40 controls the high frequency electric power supply 20 and controls ON and OFF of a high frequency electric power supply to the ICP coil 34. A gas supply unit 51 is controlled to adjust the types and flow rates of gases supplied from the respective mass flow controllers 50-1 to 50-4 to inside of the quartz chamber 12. When the etching gas is supplied, the control unit 40 operates the pump 15 and controls the pressure adjustment mechanism 14 to adjust pressure inside the processing chamber 1 to a desired pressure.

While operating the DC electric power supplies 31 for electrostatic attraction to electrostatically attract the wafer 2 to the stage 4, and operating the mass flow controller 50-4 that supplies the He gas between the wafer 2 and the stage 4, the control unit 40 controls the IR lamp electric power supply 64 and the chiller 38 based on the temperature in the stage 4 measured by the thermocouple thermometer 71 as well as information on temperature distribution of the wafer 2 determined by the arithmetic unit 41, so that the temperature of the wafer 2 falls within a predetermined temperature range. The information on temperature distribution of the wafer 2 is determined based on information on spectral intensities near the center portion of the wafer 2, near the middle portion of the wafer 2 in the radial direction, and near the outer periphery of the wafer 2, which are measured by the detector 97.

Figure 27:
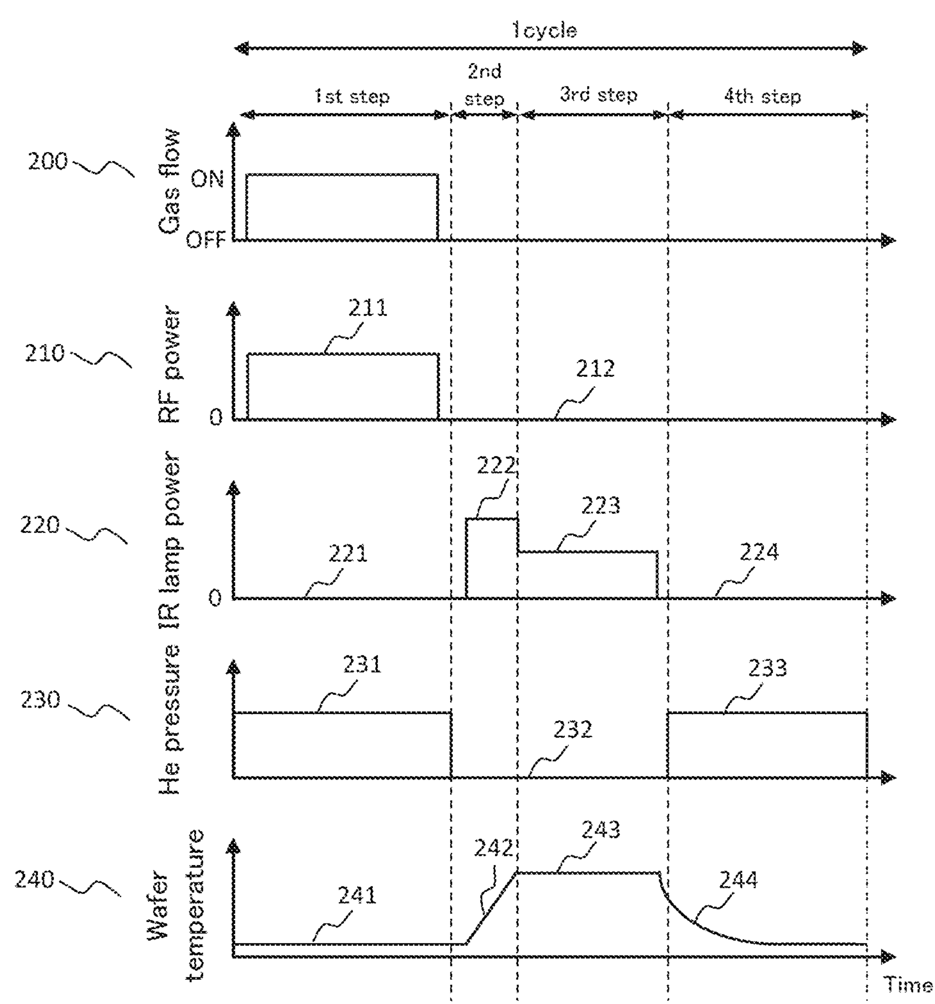
FIG. 27 is a view illustrating an example of a temporal variation of parameters in the isotropic atomic layer etching according to an embodiment of the invention, and a processing gas flow rate, a radio frequency power supply power, infrared lamp power, a rear surface He flow rate, and a wafer surface temperature in this order from an upper end.

FIG. 27 is a time chart for one cycle when isotropic atomic layer etching of the TiAlC film is performed by the plasma processing apparatus 100.

First, the wafer 2, on which the TiAlC film to be etched is formed, is carried into the processing chamber 1 via a transport port (not shown) provided in the processing chamber 1 and is placed on the stage 4. The control unit 40 operates the DC electric power supplies 31 to electrostatically attract and fix the wafer 2 to the stage 4, and controls the gas supply unit 51 to supply the He gas for wafer cooling between the back surface of the wafer 2 and the stage 4 from the mass flow controller 50-4 corresponding to the He gas, so that pressure 230 of the He gas between the back surface of the wafer 2 and the stage 4 is set to a predetermined pressure 231 and a wafer temperature 240 is set to a temperature 241. In the example, the wafer temperature 241 is 20° C.

Subsequently, the control unit 40 adjusts a flow rate of the gas, which is a mixture of $N_2$ and $H_2$, which is the reaction gas supplied into the processing chamber 1 by the mass flow controller 50-2 and 50-3, and adjusts an opening degree of the pressure adjustment mechanism 14, so that pressure inside the processing chamber 1 and pressure inside the quartz chamber 12 are set to target pressure. In the state, the control unit 40 turns on the high frequency electric power supply 20 to apply discharging electric power 211, thereby starting plasma electric discharge inside the quartz chamber 12 and generating plasma 10 inside the quartz chamber 12. At this time, since the temperature of the wafer 2 is maintained at 20° C., an electric power 220 applied to the IR lamp 62 is zero (electric power 221).

In the state, a part of the mixture of $N_2$ and $H_2$ is ionized and dissociated in the plasma 10. The neutral gas and the neutral radicals which are not ionized in the region where the plasma 10 is generated pass through the slit plate 78 so that the wafer 2 is irradiated with the neutral gas and the neutral radicals including NH. The radicals are adsorbed on the surface of the wafer 2 and react with the TiAlC film to generate the surface reaction layer including $Al(C_xH_y)_z$, Ti—$(N(C_xH_y)_z)$, and Ti—$(CN)_x$. Due to the effect of the slit plate 78, ions generated in the plasma 10 hardly enter the wafer 2. Therefore, the surface reaction of the TiAlC film mainly isotropically proceeds by the radicals, and a surface reaction layer is generated on a surface of a TiAlC film. A thickness of the generated surface reaction layer increases depending on plasma processing time using the gas mixture and a plasma processing temperature. However, an amount of surface reaction layer is saturated when 15 seconds have elapsed at the temperature in this case. Therefore, the time for plasma processing using the vapor is set to 15 seconds.

After the plasma processing time required to form the surface reaction has elapsed, the control unit 40 turns off the high frequency electric power supply 20 (discharging electric power 212) and stops the plasma electric discharge. The gas remaining in the processing chamber 1 is exhausted by the exhaust mechanism. The supply of the He gas to the back surface of the wafer is stopped, the valve 52 is opened, and the pressure on the back surface of the wafer 2 is set equal to the pressure in the processing chamber 1. The He gas on the back surface of the wafer is removed, whereby the pressure 230 of the He gas on the back surface of the wafer is set to pressure 232. The above is the first step.

Subsequently, the control unit 40 turns on an output of the IR lamp electric power supply 64 to turn on the IR lamp 62 (electric power 222). The IR light emitted from the IR lamp 62 passes through the IR light transmission window 74 and heats the wafer 2. Accordingly, the temperature of the wafer is raised as indicated as a wafer temperature 242. The wafer temperature 240 reaches 200° C. 25 seconds after the start of the temperature raising when the second step is terminated. In the example, the wafer temperature to be reached is set to 200° C.

Once the wafer temperature 240 reaches 200° C. (wafer temperature 243), the control unit 40 reduces the output of the IR lamp electric power supply 64 to electric power 223, thereby keeping the temperature of the wafer 2 constant at the temperature 243 for a certain period of time. Pressure is set as 5 Pa. The surface reaction layer that consists of $Al(C_xH_y)_z$, Ti—$(N(C_xH_y)_z)$, and Ti—$(CN)_x$ is removed because it is volatile at the elevated temperature so that the thickness of the TiAlC film is reduced. The entire surface reaction layer is removed, so that the etching is stopped and a surface of TiAlC layer is exposed.

In the second step and the present step (the third step), the wafer 2 is heated by the electromagnetic wave from the IR lamp 62, so that a surface of the wafer necessarily to be heated can be efficiently warmed. For example, even when there is a temperature difference of about 180° C., the heating can be rapidly completed. Although it is described that the wafer 2 is heated in a state where the wafer 2 is placed on the stage 4, the wafer 2 may be raised from the stage 4 by using a lift pin or the like and irradiated with the IR light (the electromagnetic wave) in a state where the wafer 2 is not in thermal contact with the stage 4. Accordingly, heat transfer from the wafer 2 to the stage 4 can be prevented and the temperature of the wafer 2 can thus be raised to a desired temperature in a shorter time. In this case, the temperature of the wafer 2 may be measured using the light that is emitted from the IR lamp 62, transmits through the wafer 2 and reaches the optical fibers 92-2. A power ratio of the IR lamps 62-1, 62-2 and 62-3 may be controlled based on a radial temperature distribution in a plane of the wafer 2.

Thereafter, the control unit 40 turns off the output of the IR lamp electric power supply 64 (electric power 224) and stops the heating of the wafer 2. The gas remaining in the processing chamber 1 is rapidly exhausted by the exhaust mechanism. Thus, the third step is terminated.

Subsequently, the control unit 40 controls the mass flow controller 50-1 for Ar gas supply and the mass flow controller 50-4 for He gas supply to supply an Ar gas into the processing chamber 1 and supply the He gas between the back surface of the wafer 2 and the stage 4, so that the pressure 230 of the He gas between the back surface of the wafer 2 and the stage 4 is set to a predetermined pressure 233 and the cooling of the wafer 2 is started (temperature 244). The wafer temperature is cooled to 20° C. and time required for the cooling is 30 seconds. Therefore, the fourth step is terminated.

In this manner, in the present embodiment, the surface reaction processing in the first step and the sublimation removal processing in the third step isotropically proceed, so that a thickness of the TiAlC film decreases from an initial thickness of the film. The cycle including the first to the fourth steps is repeated ten times in this example, so that etching of the whole TiAlC film was performed. And the surface of TiN under layer was exposed. The damages produced on the TiN under layer is negligible because of the low damage nature of the heating step.

REFERENCE SIGNS LIST

1: processing chamber, 2: wafer, 3: electric discharge region, 4: wafer stage, 5: shower plates, 6: top plate, 11: base chamber, 12: quartz chamber, 14: pressure adjustment mechanism, 15: pump, 16: vacuum exhaust pipe, 17: gas dispersion plate, 20: high frequency electric power supply, 22: matching unit, 25: high frequency cut-off filter, 30: electrodes, 31: DC electric power supplies, 34: ICP coil, 38: chiller, 39: refrigerant flow path, 40: control unit, 41: arithmetic unit, 50: mass flow controller, 51: gas supply unit, 60: container, 62: IR lamp, 63: reflection plate, 64: IR lamp electric power supply, 70: thermocouple, 71: thermocouple thermometer, 74: IR light transmission window, 75: gas flow path, 78: slit plate (ion shielding plate), 81: O-ring, 92: optical fiber, 93: external IR light source, 94: optical path switch, 95: light distributor, 96: spectroscope, 97: detector, 98: optical multiplexer, 100: plasma processing apparatus, 200: gas flow, 210: RF power, 220: IR lamp power, 230: He pressure, 240: wafer temperature, 300: capacitively coupled plasma (CCP) etching system, 301: lower electrode, 302: matching circuit, 303: MF power, 311: upper electrode, 312: matching circuit, 313: VHF power, 340: wafer, 341: sample, 350: spectroscopic ellipsometer.

The invention claimed is:

1. A continuous etching method for etching a metal carbide over a metal nitride, comprising steps of:

supplying plasma that is generated from a gas mixture that contains $N_2$ and $H_2$ and does not contain halogen gases including fluorine, chlorine, bromine, and iodine to a surface of metal carbide on at least a part of the surface, to modify the surface of metal carbide; and removing the modified surface on metal carbide by ion irradiation.

2. The etching method according to claim 1, wherein a metal carbide is titanium aluminum carbide.

3. The etching method according to claim 1, wherein a metal nitride is titanium nitride.

4. The etching method according to claim 1, wherein the modified surface includes CH, CN, and NH.

5. The etching method according to claim 1, wherein the pressure of the plasma is lower than 1000 Pa.

6. The etching method according to claim 1, wherein the temperature of the metal carbide is higher than 20° C.

7. The etching method according to claim 1, wherein the gas mixture contains $O_2$.

8. The etching method according to claim 7, wherein a volumetric flow rate ratio of $O_2$ in the gas mixture is less than 10%.

9. A cyclic etching method for etching a metal carbide over a metal nitride, comprising one or more cycles of:

a step of modification of a surface of metal carbide by supplying plasmas that is generated from a gas mixture that contains $N_2$ and $H_2$ and does not contain halogen gases including fluorine, chlorine, bromine, and iodine to a surface of metal carbide on at least a part of the surface; and a step of removal of the modified surface from the surface of the metal carbide by ion irradiation.

10. The etching method according to claim 9, wherein a metal carbide is titanium aluminum carbide.

11. The etching method according to claim 9, wherein a metal nitride is titanium nitride.

12. The etching method according to claim 9, wherein the modified surface includes CH, CN, and NH.

13. The etching method according to claim 9, wherein the pressure of the plasma is lower than 1000 Pa.

14. The etching method according to claim 9, wherein the temperature of the metal carbide is higher than 20° C.

15. The etching method according to claim 9, wherein the gas mixture contains $O_2$.

16. The etching method according to claim 15, wherein a volumetric flow rate ratio of $O_2$ in the gas mixture is less than 10%.

17. A cyclic etching method for etching a metal carbide over a metal nitride, comprising one or more cycles of:

a step of modification of a surface of metal carbide by supplying plasmas that is generated from a gas mixture that contains $N_2$ and $H_2$ and does not contain halogen gases including fluorine, chlorine, bromine, and iodine to a surface of metal carbide on at least a part of the surface; and a step of removal of the modified surface from the surface of the metal carbide by heating.

18. The etching method according to claim 17, wherein a metal carbide is titanium aluminum carbide.

19. The etching method according to claim 17, wherein a metal nitride is titanium nitride.

20. The etching method according to claim 17, wherein the modified surface includes CH, CN, and NH.

21. The etching method according to claim 17, wherein the pressure of the plasma is lower than 1000 Pa.

22. The etching method according to claim 17, wherein the temperature of the metal carbide is higher than 20° C.

23. The etching method according to claim 17, wherein the heating was carried out by irradiating infrared light from lamps.

24. The etching method according to claim 17, wherein the gas mixture contains $O_2$.

25. The etching method according to claim 24, wherein a volumetric flow rate ratio of $O_2$ in the gas mixture is less than 10%.

* * * * *